(12) United States Patent
Zhu et al.

(10) Patent No.: US 10,763,787 B2
(45) Date of Patent: Sep. 1, 2020

(54) CIRCUITS FOR WIRELESS COMMUNICATION ON MULTIPLE FREQUENCY BANDS

(71) Applicants: Jianxun Zhu, New York, NY (US); Peter R. Kinget, Summit, NJ (US)

(72) Inventors: Jianxun Zhu, New York, NY (US); Peter R. Kinget, Summit, NJ (US)

(73) Assignee: The Trustees of Columbia University in the City of New York, New York, NY (US)

( * ) Notice: Subject to any disclaimer, the term of this patent is extended or adjusted under 35 U.S.C. 154(b) by 181 days.

(21) Appl. No.: 15/765,795

(22) PCT Filed: Oct. 4, 2016

(86) PCT No.: PCT/US2016/055374
§ 371 (c)(1),
(2) Date: Apr. 4, 2018

(87) PCT Pub. No.: WO2017/062386
PCT Pub. Date: Apr. 13, 2017

(65) Prior Publication Data
US 2018/0287559 A1 Oct. 4, 2018

Related U.S. Application Data

(60) Provisional application No. 62/236,965, filed on Oct. 4, 2015, provisional application No. 62/297,919, filed
(Continued)

(51) Int. Cl.
*H03C 3/40* (2006.01)
*H04B 1/10* (2006.01)
(Continued)

(52) U.S. Cl.
CPC .............. *H03C 3/40* (2013.01); *H03D 7/166* (2013.01); *H03F 3/19* (2013.01); *H03F 3/245* (2013.01);
(Continued)

(58) Field of Classification Search
CPC .. H03H 7/38; H03H 2007/013; H03H 7/0115; H03H 7/48; H04B 7/12;
(Continued)

(56) References Cited

U.S. PATENT DOCUMENTS 4,656,434 A   4/1987 Selin
5,222,246 A   6/1993 Wolkstein
(Continued)

FOREIGN PATENT DOCUMENTS

CN   201510104422   6/2015

OTHER PUBLICATIONS

Qorvo, "Addressing Carrier Aggregation Challenges Using Multiplexer Solutions," White Paper, Jan. 2016, pp. 1-6.
(Continued)

*Primary Examiner* — Arnold M Kinkead
(74) *Attorney, Agent, or Firm* — Byrne Poh LLP

(57) ABSTRACT

Circuit for wireless communication are provided, the circuits comprising: a first quadrature hybrid having a first in port, a first iso port, a first cpl port, and a first thru port; a first mixer having a first input coupled to the first cpl port and having an output; a second mixer have a first input coupled to the first cpl port and having an output; a third mixer having a first input coupled to the first thru port and having an output; a fourth mixer having a first input coupled to the first thru port and having an output; and a first complex combiner having inputs coupled to the output of the first mixer, the output of the second mixer, the output of the third mixer, and the output of the fourth mixer that provides first
(Continued)

I and Q outputs based the output of the first mixer and the output of the second mixer.

20 Claims, 22 Drawing Sheets

Related U.S. Application Data on Feb. 21, 2016, provisional application No. 62/339,693, filed on May 20, 2016, provisional application No. 62/385,193, filed on Sep. 8, 2016.

(51) Int. Cl.

| | | |
|---|---|---|
| H03H 7/48 | (2006.01) | |
| H04B 7/005 | (2006.01) | |
| H03F 3/68 | (2006.01) | |
| H04B 1/52 | (2015.01) | |
| H03H 7/01 | (2006.01) | |
| H03H 7/38 | (2006.01) | |
| H04B 7/12 | (2006.01) | |
| H04B 7/06 | (2006.01) | |
| H04B 3/32 | (2006.01) | |
| H03D 7/16 | (2006.01) | |
| H03F 3/19 | (2006.01) | |
| H03F 3/24 | (2006.01) | |
| H04L 5/00 | (2006.01) | |
| H03F 3/45 | (2006.01) | |

(52) U.S. Cl.
CPC ............ *H03F 3/68* (2013.01); *H03H 7/0115* (2013.01); *H03H 7/38* (2013.01); *H03H 7/48* (2013.01); *H04B 1/10* (2013.01); *H04B 1/52* (2013.01); *H04B 3/32* (2013.01); *H04B 7/005* (2013.01); *H04B 7/068* (2013.01); *H04B 7/0617* (2013.01); *H04B 7/12* (2013.01); *H03F 3/45475* (2013.01); *H03F 2200/192* (2013.01); *H03F 2200/198* (2013.01); *H03F 2200/204* (2013.01); *H03F 2200/294* (2013.01); *H03F 2200/336* (2013.01); *H03F 2200/405* (2013.01); *H03F 2200/451* (2013.01); *H03F 2200/534* (2013.01); *H03F 2200/537* (2013.01); *H03F 2203/45512* (2013.01); *H03F 2203/45522* (2013.01); *H03F 2203/45526* (2013.01); *H03F 2203/45528* (2013.01); *H03F 2203/45548* (2013.01); *H03F 2203/45591* (2013.01); *H03H 2007/013* (2013.01); *H04L 5/001* (2013.01)

(58) Field of Classification Search
CPC ........ H04B 7/068; H04B 7/0617; H04B 3/32; H04B 1/10; H04B 7/005; H04B 1/52; H03C 3/40; H03F 3/68; H03F 3/245; H03D 7/166; H03D 7/1458; H04L 5/001
USPC ........... 375/229; 455/260; 370/295; 333/117, 333/174
See application file for complete search history.

(56) References Cited

U.S. PATENT DOCUMENTS

| | | | |
|---|---|---|---|
| 5,412,351 | A | 5/1995 | Nystrom et al. |
| 6,111,452 | A * | 8/2000 | Fazi ............... H03D 7/1408 327/113 |
| 6,240,142 | B1 * | 5/2001 | Kaufman ............... H03C 3/403 375/261 |
| 7,003,265 | B2 | 2/2006 | Jeon et al. |
| 8,149,742 | B1 | 4/2012 | Sorsby |
| 8,306,480 | B2 | 11/2012 | Muhammad et al. |
| 8,462,609 | B2 | 6/2013 | Berggren et al. |
| 8,514,793 | B2 | 8/2013 | Gauvreau et al. |
| 8,654,685 | B2 | 2/2014 | Kim et al. |
| 8,737,547 | B2 | 5/2014 | Amrutur et al. |
| 8,737,935 | B2 | 5/2014 | Afsahi et al. |
| 8,957,722 | B2 | 2/2015 | Zienkewitz et al. |
| 8,989,105 | B2 | 3/2015 | Wu |
| 8,995,591 | B2 | 3/2015 | Gudem et al. |
| 9,048,284 | B2 | 6/2015 | McPartlin et al. |
| 9,065,523 | B2 | 6/2015 | Campos et al. |
| 9,083,518 | B2 | 7/2015 | Bauder et al. |
| 9,300,420 | B2 | 3/2016 | Chang et al. |
| 9,325,042 | B2 | 4/2016 | Taniuchi et al. |
| 2005/0036563 | A1 | 2/2005 | Suzuki et al. |
| 2009/0233568 | A1 | 9/2009 | Zhang et al. |
| 2009/0289744 | A1 | 11/2009 | Miyashiro |
| 2010/0003943 | A1 | 1/2010 | Seendripu et al. |
| 2012/0140743 | A1 | 6/2012 | Pelletier et al. |
| 2012/0300887 | A1 | 11/2012 | Seendripu et al. |
| 2013/0309979 | A1 | 11/2013 | Wu |
| 2015/0109977 | A1 | 4/2015 | Loh |
| 2015/0117280 | A1 | 4/2015 | Khlat et al. |
| 2015/0163044 | A1 | 6/2015 | Analui et al. |
| 2017/0317711 | A1 * | 11/2017 | Jian ..................... H04B 1/525 |

OTHER PUBLICATIONS

Microchip Technology Inc., "MCP4728—12-Bit, Quad Digital-to-Analog Converter with EEPROM Memory," Datasheet, 2010, pp. 1-69.

Agilent Technologies, "Noise Figure Measurement Accuracy—The Y-Factor Method," Application Note 57-2, Feb. 2014, pp. 1-46.

Avago Tech, "App Notes 5441: LNA Design with the MGA-16516 Matched Pair, Low Noise Amplifier", Technical Paper, Aug. 13, 2010, pp. 1-16.

B. van Liempd et al., "A 0.9 V 0.4-6 GHz Harmonic Recombination SDR Receiver in 28 nm CMOS With HR3/HR5 and IIP2 Calibration," IEEE J. Solid-State Circuits, vol. 49, No. 8, pp. 1815-1826, Aug. 2014.

Belostotski et al., "Sub-0.2 dB Noise Figure Wideband Room-Temperature CMOS LNA With Non-50 Signal-Source Impedance," in IEEE Journal of Solid-State Circuits, vol. 42, No. 11, Nov. 2007, pp. 2492-2502.

Blaakmeer et al., "Wideband Balun-LNA With Simultaneous Output Balancing, Noise-Canceling and Distortion-Canceling", In IEEE Journal of Solid-State Circuits, vol. 43, No. 6, Jun. 2008, pp. 1341-1350.

Borremans et al., "A 40 nmCMOS 0.4-6 GHz Receiver Resilient to Out-of-Band Blockers," In IEEE Journal of Solid-State Circuits, vol. 46, No. 7, Jul. 2011, pp. 1659-1671.

Bruccoleri et al., "Wide-Band CMOS Low-Noise Amplifier Exploiting Thermal Noise Canceling", in IEEE Journal of Solid-State Circuits, vol. 39, No. 2, Feb. 2004, pp. 275-282.

Chen et al., "Dual-Carrier Aggregation Receiver with Reconfigurable Front-End RF Signal Conditioning", In IEEE Journal of Solid-State Circuits, vol. 50, No. 8, Apr. 20, 2015, pp. 1874-1888.

Chen et al., "Reconfigurable Receiver with Radio-Frequency Current-Mode Complex Signal Processing Supporting Carrier Aggregation", In IEEE Journal of Solid-State Circuits, vol. 50, No. 12, Aug. 17, 2015, pp. 3032-3046.

Chen et al., "Reconfigurable SDR Recevier with Enhanced Front-End Frequency Selectivitiy Suitable for Intra-Band and Inter-Band Carrier Aggregation", In IEEE 2015 International Solid-State Circuits Conference Digest of Technical Papers, Feb. 25, 2015, pp. 1-3.

Conta et al., "A 0.9dB NF 9mW 28nm Triple-Band GNSS Radio Receiver", in IEEE Radio Frequency Integrated Circuits Symposium, Jun. 2014, pp. 213-216.

European Telecommunications Standards Institute, "LTE; Evolved Universal Terrestrial Radio Access (E-UTRA); User Equipment (UE) Radio Transmission and Reception (3GPP TS 36.101 version 13.3.0 Release 13)", Technical Specification, Mar. 2016, pp. 1-931.

(56) References Cited

OTHER PUBLICATIONS

Fabiano et al., "SAW-less Analog Front-End Receivers for TDD and FDD", IEEE Journal of Solid-State Circuits, vol. 48, No. 12, Dec. 2013, pp. 3067-3079.

Girard, P.A. and Solal, M., "High Performance Single-Balanced Duplexer", In IEEE International Microwave Symposium, Jun. 2007, pp. 861-864.

Glynn et al., "A 28GHz, 4-channel Phase Adjustable Power Amplifier IC for 5G front-ends", Plextek RFI White Paper, Mar. 2015, pp. 1-5.

He et al., "A Compact SAW-less Multiband WCDMA/GPS Receiver Front-End with Translational Loop for Input Matching," in Digest of Technical Papers IEEE International Solid-State Circuits Conference, Feb. 23, 2011, pp. 372-374.

Hong et al., "Applications of self-interference cancellation in 5G and beyond", IEEE communications Magazine, vol. 52, Issue 2, Feb. 2014, pp. 114-121.

Hwu et al., "A Receiver Architecture for Intra-Band Carrier Aggregation", In VLSI Circuits Digest of Technical Papers, 2014 Symposium, Jun. 10, 2014, pp. 1-2.

Hwu et al., "An RF Receiver for Intra-Band Carrier Aggregation", In IEEE Journal of Solid-State Circuits, vol. 50, No. 4, Apr. 2015, pp. 946-961.

International Preliminary Report on Patentability dated Apr. 10, 2018 in International Patent Application No. PCT/US2016/055374.

International Search Report and Written Opinion dated Aug. 10, 2017 in International Patent Application No. PCT/US2017/033857.

International Search Report and Written Opinion dated Dec. 28, 2016 in International Patent Application No. PCT/US2016/055374.

Izquierdo et al., "Reconfigurable Wide-Band Receiver with Positive Feed-Back Translational Loop", in IEEE Radio Frequency Integrated Circuits Symposium, Jun. 2011, pp. 1-4.

Jeon et al., "A Scalable 6-to-18 GHz Concurrent Dual-Band Quad-Beam Phased-Array Receiver in CMOS," IEEE Journal of Solid-State Circuits, vol. 43, No. 12, Dec. 2008, pp. 2660-2673.

Ji, D. et al., "A Novel Load Mismatch Detection and Correction Technique for 3g/4g Load In-Sensitive Power Amplifier Application", In IEEE Transactions on Microwave Theory and Techniques, vol. 63, No. 5, May 2015, pp. 1530-1543.

Kerr, A., "On the Noise Properties of Balanced Amplifiers", In IEEE Microwave and Guided Wave Letters, vol. 8, No. 11, Nov. 1998, pp. 390-392.

Kim et al., "A Wideband Front-End Receiver Implementation on GPUs", in IEEE Transactions on Signal Processing, vol. 64, issue 10, pp. 2602-2612.

Kim et al., "An FBAR- and LTCC-based RF front-end module for Wi-Fi and WiMAX dual-mode systems", Microwave and Optical Technology Letters, vol. 52, Issue 3, Mar. 2010, pp. 753-757.

Kitayabu et al., "Concurrent Dual-Band Transmitter Architecture for Spectrum Aggregation System", In IEEE Radio and Wireless Symposium, Sep. 26, 2010, pp. 689-692.

Klemmer et al., "A 45nm CMOS RF-to-Bits LTE/WCDMA FDD/TDD 2×2 MIMO Base-Station Transceiver SoC with 200MHz RF Bandwidth," in Digest of Technical Papers IEEE International Solid-State Circuits Conference, Jan. 2016, pp. 164-165.

Klumperink et al., "Achieving Wideband Sub-1dB Noise Figure and High Gain with MOSFETs if Input Power Matching is not Required", in IEEE Radio Frequency Integrated Circuits Symposium, Jun. 2007, pp. 673-676.

Klumperink et al., "E53: How to Achieve 1000x More Wireless Data Capacity? 5G?" in Digest of Technical Papers IEEE International Solid-State Circuits Conference, Feb. 2015, pp. 1-1.

Kurokawa, K., "Design Theory of Balanced Transistor Amplifiers", The Bell System Technical Journal, vol. 44, No. 8, Oct. 1965, pp. 1675-1698.

Murphy et al., "A Blocker-Tolerant Wideband Noise-Cancelling Receiver with a 2dB Noise Figure," In IEEE 2012 International Solid-State Circuits Conference Digest of Technical Papers, Feb. 20, 2012, pp. 1-3.

Murphy et al., "A Blocker-Tolerant, Noise-Cancelling Receiver Suitable for Wideband Wireless Applications," IEEE Journal of Solid-State Circuits, vol. 47, No. 12, Dec. 2012, pp. 2943-2963.

Nauta, B., "A CMOS Transconductance-C Filter Technique for Very High Frequencies", in IEEE Journal of Solid-State Circuits, vol. 27, No. 2, Feb. 1992, pp. 142-153.

Oliveria et al., "A 5?GHz quadrature relaxation oscillator with mixing for improved testability or compact front-end implementation", International Journal of Circuit Theory and Applications, vol. 38, Issue 5, May 2010, pp. 359-366.

PR Newswire, "Microsemi Introduces World's First SiGe-based, Monolithic RF Front End Device Designed for Broadcom's 5G WiFi Mobile Platforms", Microsemi News Release, Nov. 2012, pp. 1-3.

Rabbeni, P. et al., "RF SOI: Revolutionizing RF System Design", In Microwave Journal, Oct. 2015.

Ramadan et al., "A reconfigurable RF front-end receiver for autonomous spectrum sensing cognitive radios", 2016 10th European Conference on Antennas and Propagation Proceedings pp. 1-2 Apr. 2016.

Roh et al., "Millimeter-wave beamforming as an enabling technology for 5G cellular communications: theoretical feasibility and prototype results", IEEE Communications Magazine, vol. 52, Issue 2, Feb. 2014, pp. 106-113.

Sundstrom et al., "Receiver for LTE Rel-11 and Beyond Supporting Non-Contiguous Carrier Aggregation", In IEEE 2013 International Solid-State Circuits Conference Digest of Technical Papers, Feb. 20, 2013, pp. 1-3.

T. Takai, H. Iwamoto, Y. Takamine, T. Wada, M. Hiramoto, M. Koshino, and N. Nakajima, "Investigations on Design Technologies for SAW Quadplexer with Narrow Duplex Gap," in Intern. Microwave Symposium, May 2016, pp. 1-4.

Tatomirescu et al., "Multi-Band Compact Antenna for Smartphones Supporting LTE Carrier Aggregation", In IEEE Vehicular Technology Conferenc, May 11-14, 2015.

Tektronix, "Real-Time Spectrum Analyzer Fundamentals," Application Note, 2009, pp. 1-52.

W. Mueller and R. Ruby, "Multiplexers as a Method of Supporting Same-Frequency-Range Down Link Carrier Aggregation," in Intern. Microwave Symposium, May 2016, pp. 1-4.

Walden et al., "Analog-to-Digital Converter Survey and Analysis", in IEEE Journal on Selected Areas in Communications, vol. 17, No. 4, Apr. 1999, pp. 539-550.

Yao et al., "1.5-2.7 GHz Ultra Low Noise Bypass LNA," in IEEE MTT-S International Microwave Symposium, Jun. 2014, pp. 1-3.

Yi et al., "A 65nm CMOS carrier-aggregation transceiver for IEEE 802.11 WLAN applications", in IEEE Radio Frequency Integrated Circuits Symposium, May 22-24, 2016.

Zhang et al., "Linearization Techniques for CMOS Low Noise Amplifiers: A Tutorial", in IEEE Transactions on Circuits and Systems I, vol. 58, No. 1, Jan. 2011, pp. 22-36.

Zhou et al., "Using Capacitive Cross-Coupling Technique in RF Low NoiseAmplifiers and Down-Conversion Mixer Design", in Proceedings European Solid-State Circuits Conference, Sep. 2000, pp. 1-5.

Zhu et al., "A Field-Programmable Noise-Canceling Wideband Receiver with High-Linearity Hybrid Class-AB-C LNTAs," in Proceedings of the IEEE Custom Integrated Circuits Conference, Sep. 2015, pp. 1-4.

Zhu, J. et al., "A Very-Low-Noise-Frequency-Translational Quadrature-Hybrid Receiver for Carrier Aggregation", in Digest of Technical Papers IEEE International Solid-State Circuits Conference, Feb. 2016, pp. 168-169.

Office Action dated Jan. 23, 2020 in U.S. Appl. No. 16/303,246, pp. 2-17.

Office Action dated Jun. 26, 2019 in U.S. Appl. No. 16/303,246, pp. 2-17.

\* cited by examiner

CIRCUITS FOR WIRELESS COMMUNICATION ON MULTIPLE FREQUENCY BANDS

CROSS-REFERENCE TO RELATED APPLICATION

This application claims the benefit of U.S. Provisional Patent Application No. 62/236,965, filed Oct. 4, 2015, U.S. Provisional Patent Application No. 62/297,919, filed Feb. 21, 2016, U.S. Provisional Patent Application No. 62/339,693, filed May 20, 2016, and U.S. Provisional Patent Application No. 62/385,193, filed Sep. 8, 2016, each which is hereby incorporated by reference herein in its entirety.

STATEMENT REGARDING GOVERNMENT FUNDED RESEARCH

This invention was made with government support under Grant #: HR0011-12-1-0006 awarded by the Department of Defense, Defense Advanced Research Projects Agency. The government has certain rights in the invention.

BACKGROUND

To meet the demands of ever-increasing data throughput, carrier aggregation (CA) between different frequency bands is becoming necessary. Differing spectrum allocations around the globe lead to a very large number of band combinations and put demanding performance requirements on the antenna interfaces for wideband receivers for interband CA. Sometimes multiple antennas are used, e.g. one for each band, but the small factor of mobile terminals severely limits the number of antennas. Splitting the antenna signal with filter banks and switches becomes very complex and costly due to the large number of band combinations (>90 currently).

Accordingly, new circuits for wireless communication capable of handling multiple frequencies are desirable.

SUMMARY

Circuit for wireless communication are provided, the circuits comprising: a first quadrature hybrid having a first in port, a first iso port, a first cpl port, and a first thru port; a first mixer having a first input coupled to the first cpl port and having an output; a second mixer have a first input coupled to the first cpl port and having an output; a third mixer having a first input coupled to the first thru port and having an output; a fourth mixer having a first input coupled to the first thru port and having an output; and a first complex combiner having inputs coupled to the output of the first mixer, the output of the second mixer, the output of the third mixer, and the output of the fourth mixer that provides first I and Q outputs based the output of the first mixer, the output of the second mixer, the output of the third mixer, and the output of the fourth mixer.

DETAILED DESCRIPTION

Figure 1:
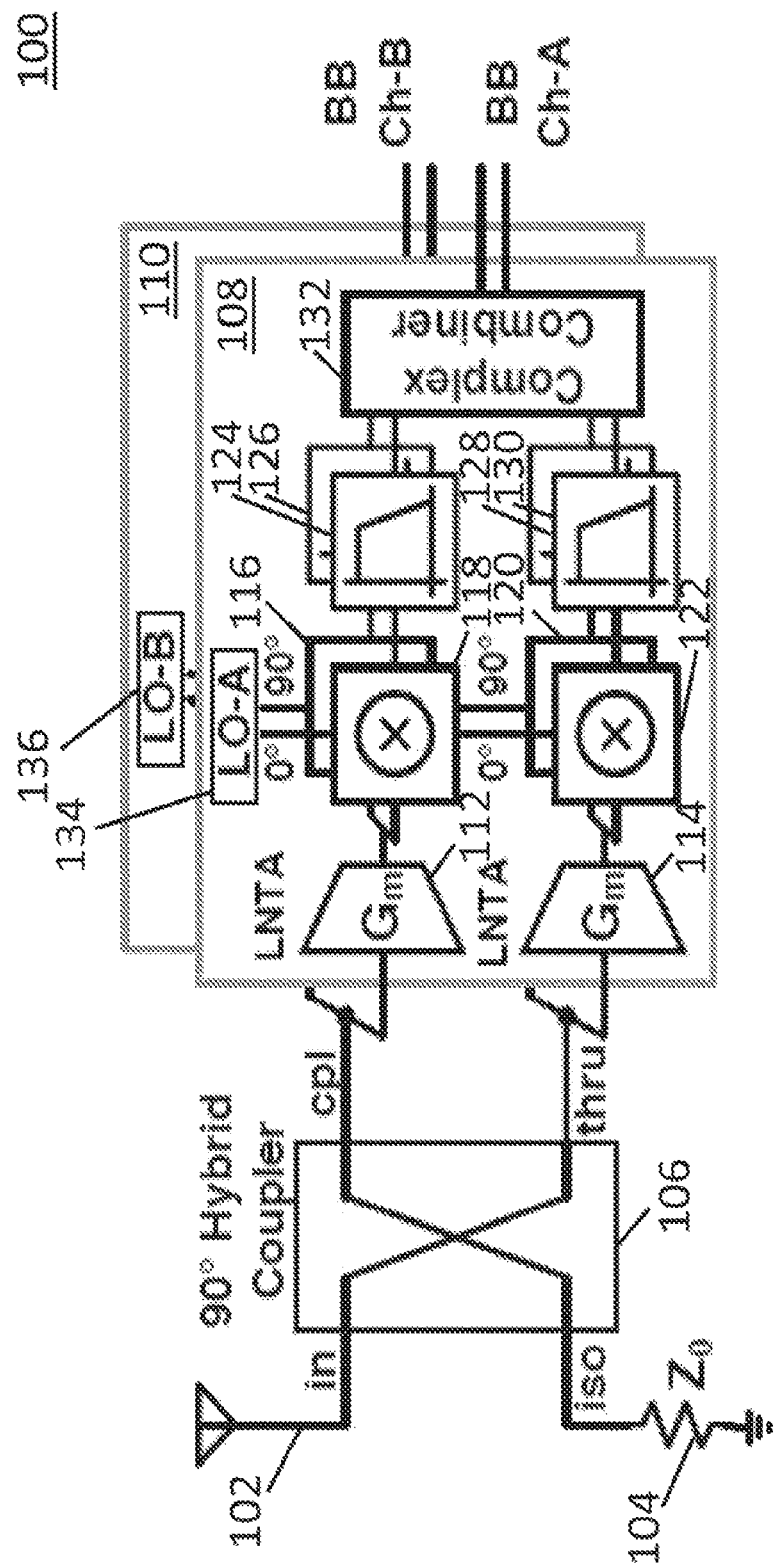
FIG. 1 is an example of a schematic of a receiver using one 90-degree hybrid coupler in accordance with some embodiments.

Turning to FIG. 1, an example 100 of a receiver in accordance with some embodiments is shown. As illustrated, receiver 100 includes an antenna 102, a termination resistor 104, a 90-degree hybrid coupler (which may also be referred to herein as a "quadrature hybrid") 106, channel A circuitry 108, and channel B circuitry 110. As shown, channel A circuitry 108 and channel B circuitry 110 can include low noise transconductance amplifiers (LNTAs) 112 and 114, mixers 116, 118, 120, and 122, filters 124, 126, 128, and 130, and a complex combiner 132. LNTA 112, mixers 116 and 118, and filters 124 and 126 form a first quadrature downconverter. LNTA 114, mixers 120 and 122, and filters 128 and 130 form a second quadrature downconverter.

As also shown, the mixers receive 0 degree and 90 degree local oscillators A 134 and 0 degree and 90 degree local oscillators B 136. In channel A circuitry 108, mixers 118 and 122 are driven by the 0-degree local oscillator A signal and mixers 116 and 120 are driven by the 90-degree local oscillator A signal. In channel B circuitry 110, mixers 118 and 122 are driven by the 0-degree local oscillator B signal and mixers 116 and 120 are driven by the 90-degree local oscillator B signal.

Figure 2:
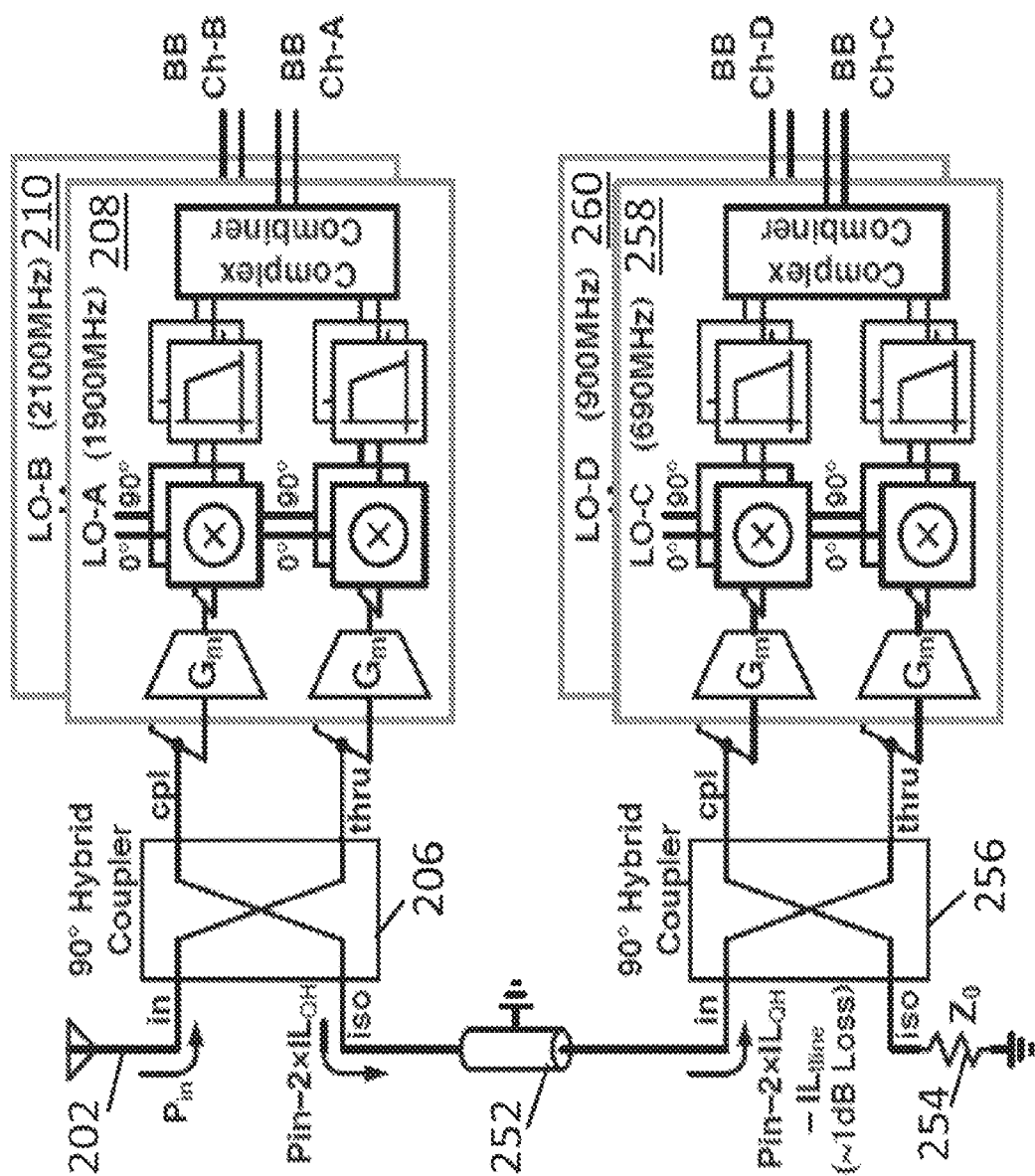
FIG. 2 is an example of a schematic of a receiver using two 90-degree hybrid couplers in accordance with some embodiments.

FIG. 2 shows another example 200 of a receiver in accordance with some embodiments. As illustrated, receiver 200 includes an antenna 202, quadrature hybrids 206 and 256, a connection 252, a termination resistor 254, channel A circuitry 208, channel B circuitry 210, channel C circuitry 258, and channel D circuitry 260.

Channel A circuitry 208, channel B circuitry 210, channel C circuitry 258, and channel D circuitry 260 can each include the components described above as being included in channel A circuitry 108 of FIG. 1.

Antennas 102 and 202 can be any suitable antennas, in some embodiments. For example, in some embodiments, antennas 102 and 202 can be antennas suitable to receive any suitable one or more frequencies, or one or more ranges of frequencies, of signals.

Termination resistors 104 and 254 can be any suitable resistors and have any suitable values (e.g., 50 ohms), in some embodiments.

Quadrature hybrids 106, 206, and 256 can be any suitable quadrature hybrids, in some embodiments. For example, in some embodiments, each can be implemented using a model X3C17A1-03WS surface mount quadrature hybrid available from ANAREN, INC. of East Syracuse, N.Y., USA.

Connection 252 can be any suitable connection between the quadrature hybrids, in some embodiments. For example, in some embodiments, the connection can be a wire connection, a printed circuit board trace, a transmission line, etc.

LNTAs 112 and 114 can be any suitable LNTAs or low-noise amplifiers (LNAs), in some embodiments. For example, in some embodiments, the LNTAs can be formed from transconductors, can be formed from discrete components (such as gallium arsenide (GaAs) transistors), can be common source LNTAs, etc. In some embodiments, each LNTA can be formed from any suitable number of parallel common source transconductors. In some embodiments, the number of such parallel common source transconductors can be increased based on characteristics of the receiver. Increasing the number of parallel common source transconductors can be used to scale up the transconductance and trade off noise factor reduction for increased power dissipation.

Mixers 116, 118, 120, and 122 can be any suitable mixers, in some embodiments. For example, in some embodiments, the mixers can be current-driven passive mixers. In some embodiments, the mixers can be active mixers or passive mixers.

Filters 124, 126, 128, and 130 can be any suitable filters, in some embodiments. For example, in some embodiments, the filters can be active or passive low pass filters of various orders and with appropriate in-band gain.

Figure 20:
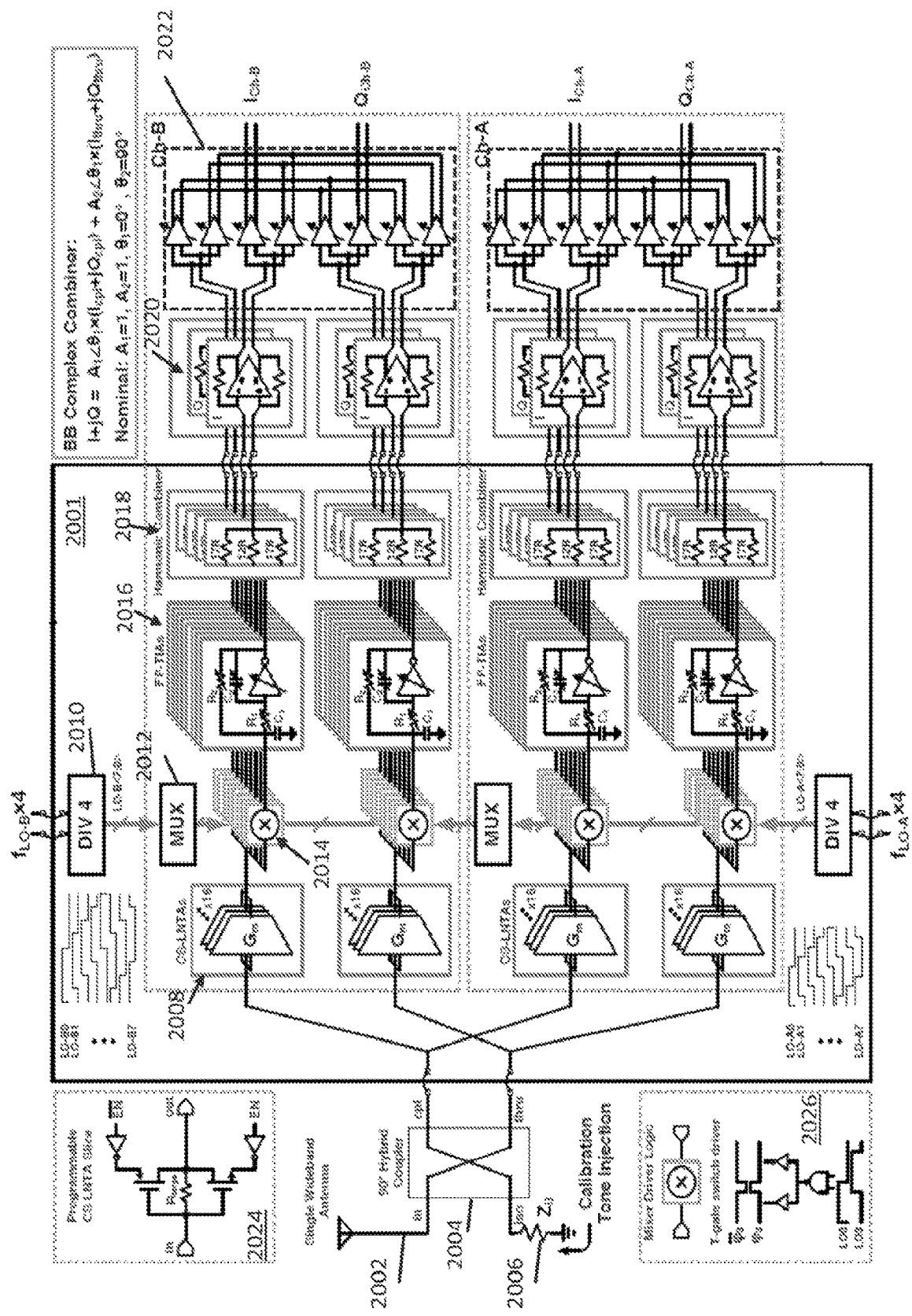
FIG. 20 is an example of an integrated circuit in accordance with some embodiments.

Complex combiner 132 can be any suitable complex combiner, in some embodiments. For example, in some embodiments, the complex combiner can be formed from variable-gain transconductance amplifiers with coupled outputs as illustrated in FIG. 20. In some embodiments variable-gain voltage amplifiers with output voltage summing can be used.

While examples of current mode devices and voltage mode devices are provided in different places herein, it should be apparent to one of ordinary skill that in some embodiments voltage mode devices can be switched with current mode devices, and vice versa, without departing from the spirit and scope of the invention. For example, in some embodiments, quadrature downconverters are described herein as using LNTAs, which provide a current mode output. It should be apparent that the LNTAs can be replaced with low noise amplifiers (LNAs), which provide a voltage mode output, in some embodiments. When such substitutions are made, other circuits, such as adjacent mixers may be changed accordingly.

Figure 3:
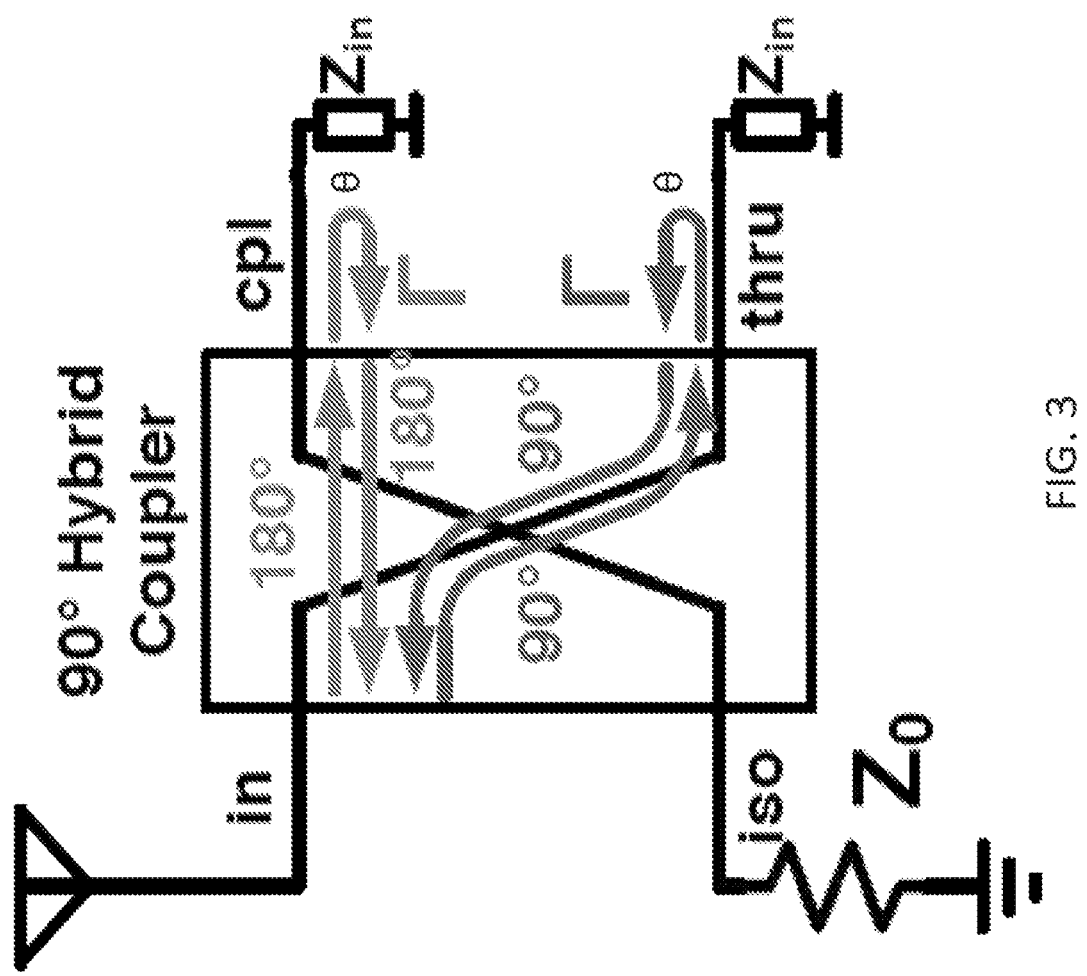
FIG. 3 is an example of reflectance in a 90-degree hybrid coupler in accordance with some embodiments.
Figure 4:
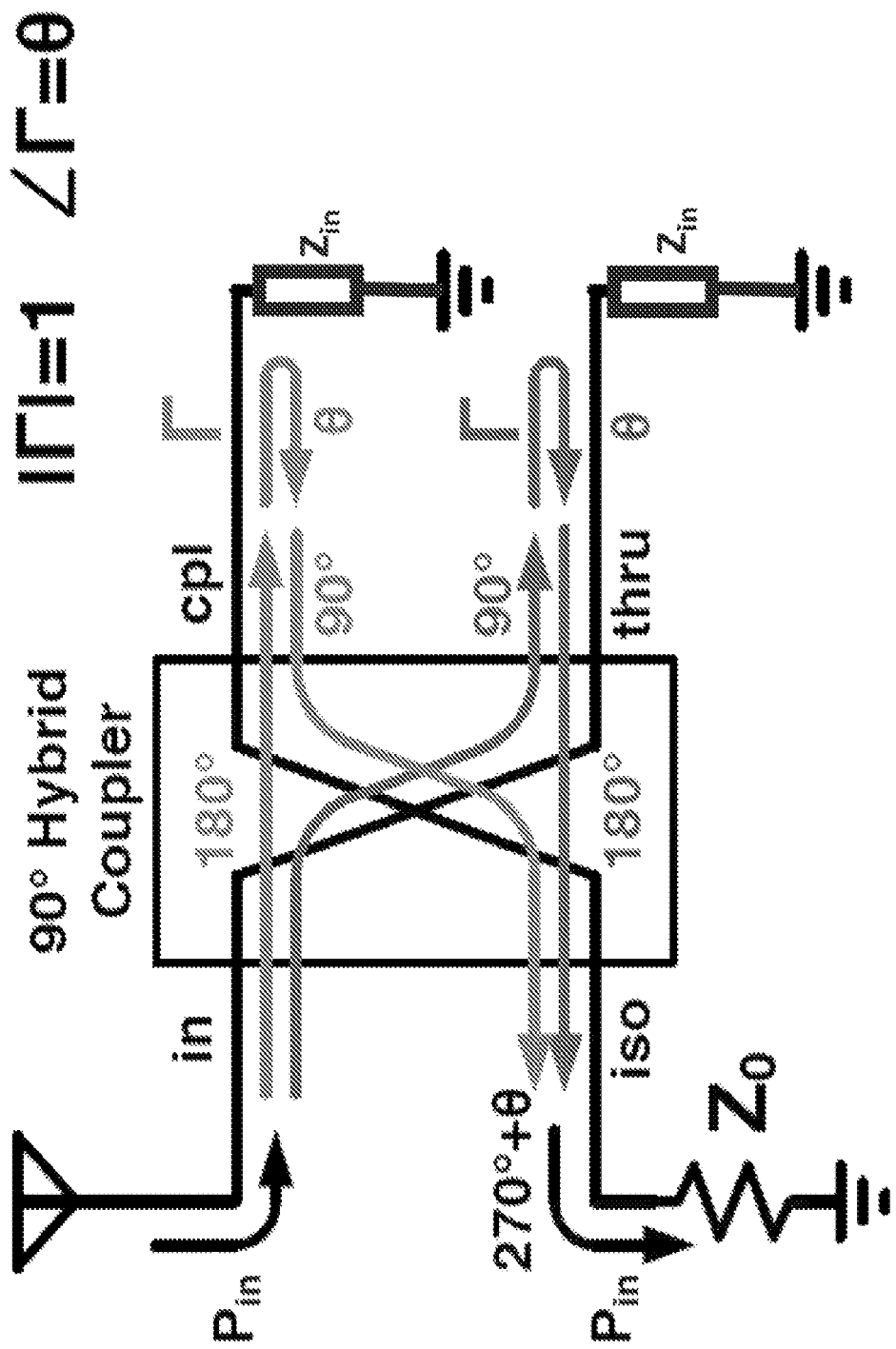
FIG. 4 is another example of reflectance in a 90-degree hybrid coupler in accordance with some embodiments.

Referring to FIGS. 3 and 4, examples of the operation of a quadrature hybrid in accordance with some embodiments is illustrated. As shown in FIG. 3, the quadrature hybrid is connected at an in port to an antenna (or any other signal source), at an iso port to a termination resistor $Z_0$, and at a cpl port and a thru port to two identical loads both with impedance $Z_{in}$. The associated reflection coefficient is $\Gamma$. The iso port is terminated with the system impedance $Z_0$.

As shown in the figure, the power of an incident wave at the in port is split equally to the cpl port and the thru port. The wave is then reflected back by the impedances $Z_{in}$ to the in port based on the reflection coefficient $\Gamma$. As illustrated, the wave going from the in port to the cpl port and back to the in port undergoes two 180-degree phase shifts, and a $\theta$ degree phase shift, for a total phase shift of $360+\theta$ degrees. The wave going from the in port to the thru port and back to the in port undergoes two 90-degree phase shifts, and a $\theta$ degree phase shift, for a total phase shift of $180+\theta$ degrees. Because the phase difference between the two waves reflected back to the in port is 180 degrees, the two waves cancel out at the in port and no reflection is observed by the source. Thus, as long as the iso port is properly terminated and the cpl port and the thru port are loaded by the same impedance Z, the input impedance matching condition is maintained.

Turning to FIG. 4, an example of the impact on the iso port of the quadrature hybrid from a signal at the in port of the quadrature hybrid is illustrated for a reflective impedance $Z_{in}$ (i.e., $|\Gamma|=1$). As shown and mentioned above, the power of the incident wave at the in port is split equally to the cpl port and the thru port. The wave is then fully reflected by the impedances $Z_{in}$ to the iso port based on the reflection coefficient $\Gamma$. As illustrated, the wave going from the in port to the cpl port to the iso port undergoes 180-degree phase shift, a $\theta$-degree phase shift, and a 90-degree phase shift, for a total phase shift of $270+\theta$ degrees. The wave going from the in port to the thru port to the iso port undergoes a 90-degree phase shift, a $\theta$-degree phase shift, and a 180-degree phase shift, for a total phase shift of $270+\theta$ degrees. Because the two waves reflected to the iso port have the same phase shift, the signal constructively interfere and the signal power delivered to the in port appears at the iso port.

The insertion loss from the in port to the iso port depends on the return loss (RL) associated with $Z_{in}$. Thus, if $Z_{in}$ is a highly reflective load, a theoretically low loss power redirection can be achieved from the in port to the iso port. In the case of a low loss quadrature hybrid, the insertion loss of the quadrature hybrid can be denoted by $IL_{hybrid}$. The total insertion loss from the in port to the iso port is then $IL(dB)=2\times IL_{hybrid}(dB)+RL(dB)$. For instance, if $Z_{in}$ is a capacitor, the magnitude of the reflection is close to 1 if the Q of the capacitance of $Z_{in}$ is high so low loss is achieved, and the phase shift can be tuned by tuning the value of the capacitance of $Z_{in}$.

Figure 5:
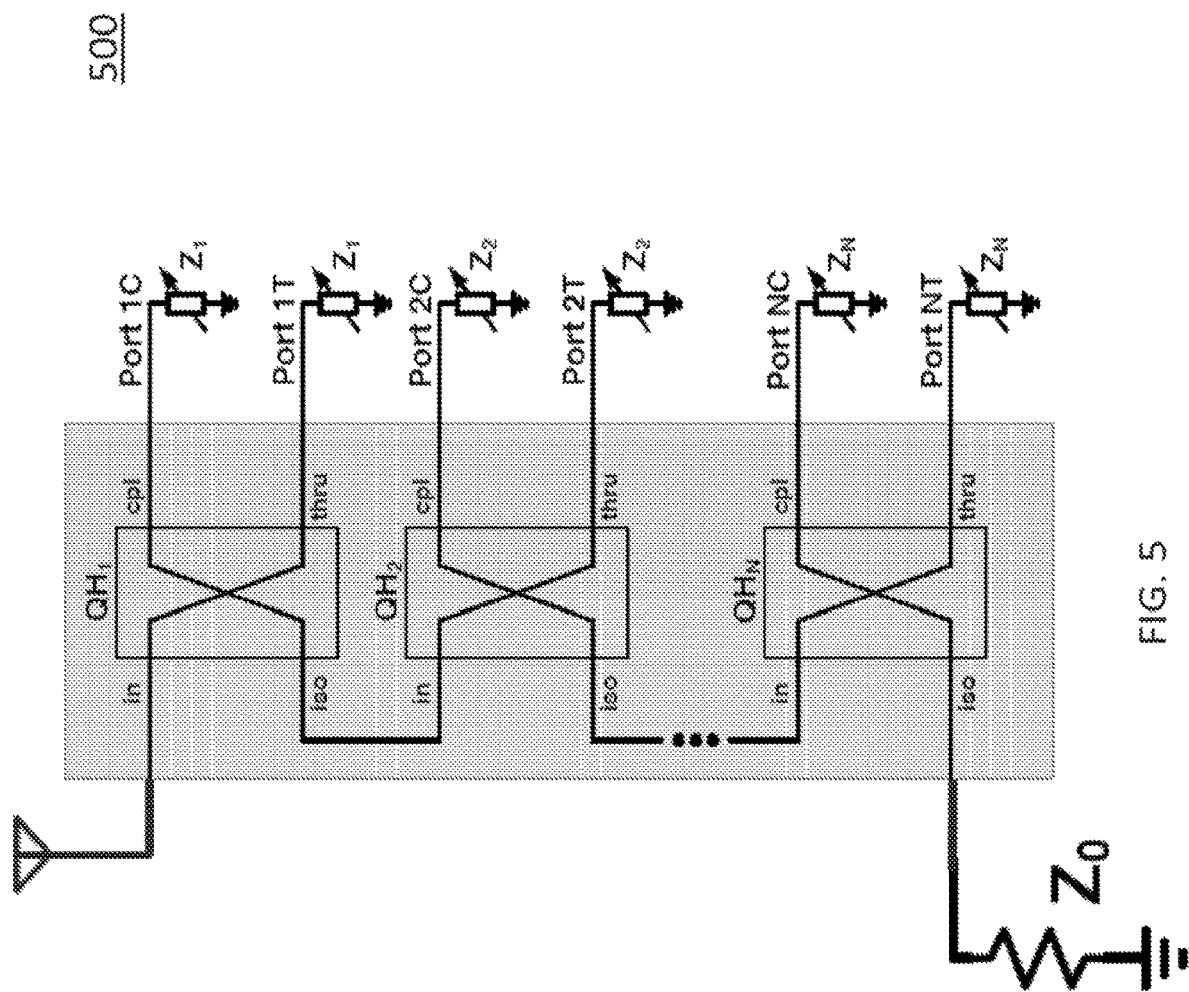
FIG. 5 is an example of cascading of 90-degree hybrid couplers in accordance with some embodiments.

Referring to FIG. 5, an architecture 500 for quadrature hybrids that can be used in some embodiments is illustrated. As shown, N quadrature hybrids $QH_1$, $QH_2$, . . . , $QH_N$ can be arranged such that the in port of $QH_1$ is connected to an antenna, the iso port of $QH_N$ is connected to a termination resistor, and the iso ports of quadrature hybrids $QH_1$ though $QH_{N-1}$ are connected to the in ports of $QH_2$ through $QH_N$, respectively. As also shown, for each quadrature hybrid, the cpl port and the thru port are connected to identical impedances. Thus, the cpl port and the thru port of $QH_1$ are each connected to a load with an impedance $Z_1$, the cpl port and the thru port of $QH_2$ are each connected to a load with an impedance $Z_2$, the cpl port and the thru port of $QH_N$ are each connected to a load with an impedance $Z_N$. As described in connection with FIG. 3, to cause that the reflections to the in port of each quadrature hybrid cancel out, the impedances at the cpl port and the thru port of each quadrature hybrid may be selected to be the same in some embodiments. However, in some embodiments, the impedance at the cpl port and the thru port of one quadrature hybrid need not be the same as the impedance at the cpl port and the thru port of any other quadrature hybrid (though they can be in some embodiments).

As described above in FIG. 4, by using reflective impedances for $Z_1, Z_2, \ldots, Z_{N-1}$ in FIG. 5, the signals at the cpl port and the thru port of $QH_1, QH_2, \ldots, QH_{N-1}$ can be reflected through the iso ports of $QH_1, QH_2, \ldots, QH_{N-1}$ to the in ports of $QH_2, QH_3, \ldots, QH_N$, respectively.

By combining the architecture of FIG. 5 with the circuit of FIG. 2, it can be seen that receivers with any suitable number of quadrature hybrids and any suitable number of channel circuitries (e.g., quadrature downconverters and complex combiners) can be used in some embodiments.

In some embodiments, the impedances at the cpl port and the thru port will be reflective to certain frequencies and non-reflective to other frequencies. By selecting the impedances appropriately, a cascade of quadrature hybrids can be configured to not forward certain frequency ranges. For example, in FIG. 500, $QH_1$ can have impedances attached to its cpl and thru ports that do not reflect frequencies around a first given frequency (such as 1400 MHz). In this way, the channel circuitries connected to $QH_1$ may be able to observe only the first given frequency, whereas the channel circuitries connected to $QH_2$ may be able to observe all frequencies except the frequencies not forwarded. Likewise, $QH_2$ can have impedances attached to its cpl and thru ports that do not reflect frequencies around a second given frequency (such 800 MHz). Thus, these frequencies as well as the frequencies around the first given frequency will not be forward to $QH_3$. In some embodiments, filters, such as SAW filters, for example, can be used to selectively pass frequencies in this manner.

Figure 22:
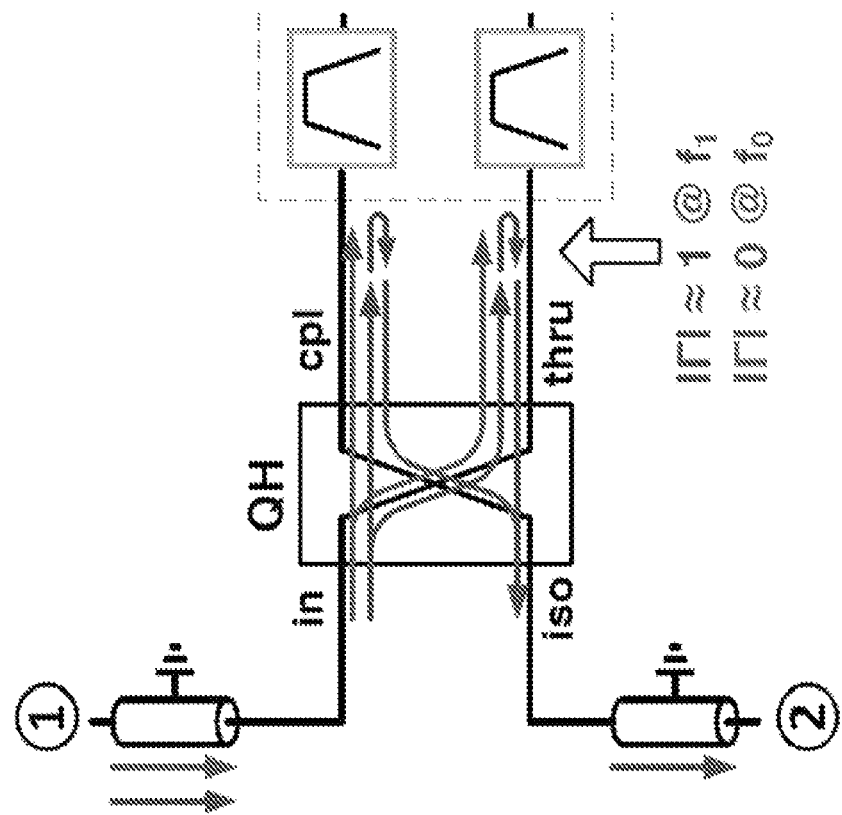
FIG. 22 is an example of selective forwarding signals in accordance with some embodiments.
Figure 22:
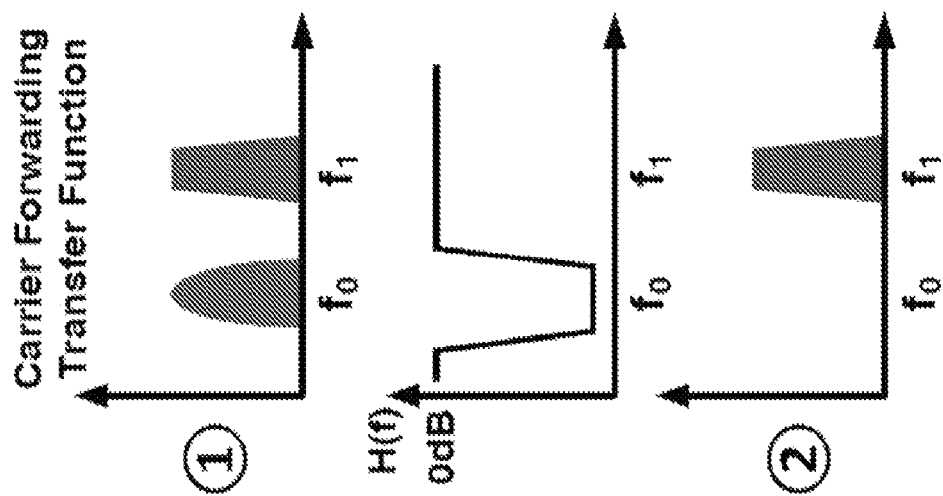

An illustration of this process is provided in FIG. 22. As shown in this figure, frequencies $f_0$ and $f_1$ are received at the in port of the quadrature hybrid. The impedances connected to the cpl and thru ports do not reflect frequency $f_0$. Hence, this frequency is not forwarded to the iso port. However, the impedances do reflect other frequencies, such as frequency $f_1$. Hence, those other frequencies, including frequency $f_1$, are forward to the iso port and the next quadrature hybrid.

Figure 6:
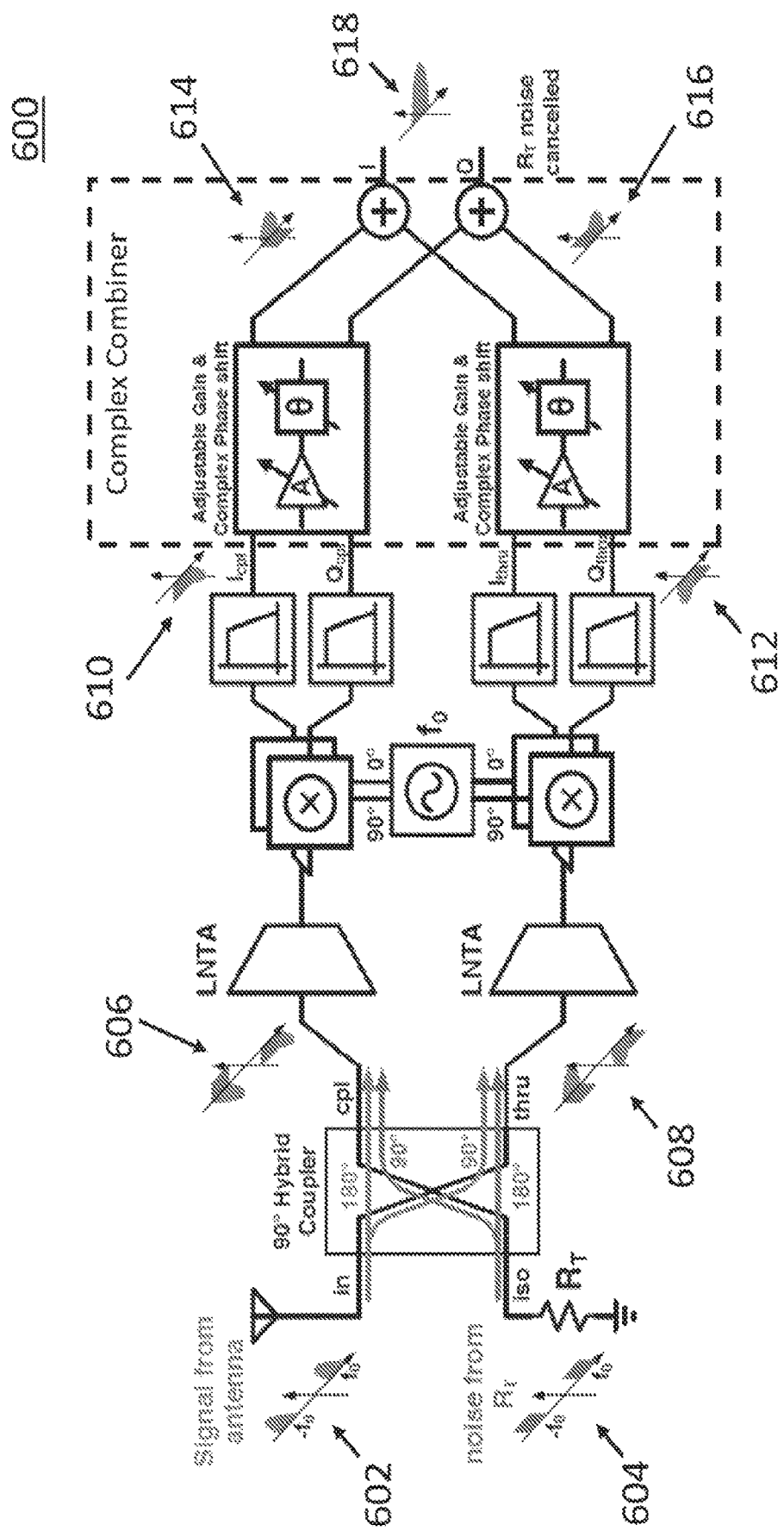
FIG. 6 is an example of noise cancellation in accordance with some embodiments.

FIG. 6 illustrates an example of how noise from a termination resistor can be cancelled in a receiver 600 in accordance with some embodiments. As shown, signal 602 is received at the in port of the quadrature hybrid from the antenna. Noise 604 is received at iso port of the quadrature hybrid from the termination resistor. This noise can be caused by any suitable factor(s). The signal is phase shifted by 180 degrees and presented on the cpl port of the quadrature hybrid, and phase shifted by 90 degrees and presented on the thru port of the quadrature hybrid. The noise is phase shifted by 90 degrees and presented on the cpl port of the quadrature hybrid, and phase shifted by 180 degrees and presented on the thru port of the quadrature hybrid. The combined phase shifted signal and noise at the cpl port and the thru port are represented in the figure by signal/noise 606 and signal/noise 608, respectively.

As shown in FIG. 6, two identical quadrature downconverters (e.g., formed by the illustrated LNTAs, mixers, and filters) are connected to the cpl port and the thru port of the quadrature hybrid. A baseband quadrature phase shift is implemented with the complex combiner. Signal/noise 610 and 612 show illustrations of the signal and noise at the inputs to the complex combiner and signal/noise 614 and 616 show illustrations of the signal and noise prior to being combined by the adders in the complex combiner. As shown, at the output of the complex combiner, the noise is cancelled out and the signal is amplified as a result of constructive interference.

In some embodiments, receivers that are capable of simultaneously receiving signals on two or more independent channels using the same antenna are provided.

For example, when using a single quadrature hybrid (e.g., quadrature hybrid 106 as shown in FIG. 1), four quadrature downconverters (e.g., as shown in channel circuitries 108 and 110 of FIG. 1) can be connected to the quadrature hybrid (e.g., as shown in FIG. 1). Each of the channel circuitries can be configured to receive signals on a different channel. In some embodiments, in such a configuration, high-input-impedance low noise transconductance amplifiers (LNTAs) can be used. Thus, the several LNTAs can be put in parallel and split the RF signal in the voltage domain.

As another example, when using multiple quadrature hybrids (e.g., quadrature hybrids 206 and 256 as shown in FIG. 2), eight quadrature downconverters (e.g., as shown in channels circuitries 208, 210, 258, and 260 of FIG. 2) with reflective input impedances (e.g., at the inputs to the LNTA transconductances (Gms)) can cause antenna signal power to be passed from the iso port of a first quadrature hybrid (e.g., 206 as shown in FIG. 2) to the in port of a next quadrature hybrid (e.g., 256 as shown in FIG. 2). If the input impedances of are purely (or nearly purely) reactive impedances (such as a capacitance or an inductance), the magnitude of the load reflection is 1 (or nearly 1) and all (or nearly all) signal power is transferred from the first quadrature hybrid to the next quadrature hybrid. As described in connection with FIG. 5, any suitable number of quadrature hybrids can be cascaded in this way and each quadrature hybrid can be connected to two, four, six, etc. quadrature downconverters.

As shown in FIG. 2, in some embodiments, a four-channel inter-band carrier-aggregating receiver with a single antenna, a two cascaded quadrature hybrids, and four channel circuitries can be used to receive signals in the 690 MHz, 900 MHz, 1900 MHz, and 2100 MHz frequency bands. In some embodiments, because the channel circuitries configured for lower frequencies may result in higher insertion loss in the quadrature hybrids to which the circuitries are connected, the lower frequency channel circuitries may be configured to be on lower quadrature hybrids in a cascade of quadrature hybrids.

In some embodiments, rather than using a termination resistor in the circuits described herein, a second antenna can be used. For example, as shown in example receiver 700 of FIG. 7, antennas 702 and 704 can be connected to the in port and the iso port, respectively, of quadrature hybrid 706. In some embodiments, as long as the two antennas have a good isolation between each other (as is the case for diversity antennas), each antenna should see a matched impedance interface. During operation, the energy absorbed by one antenna may re-emitted by the other antenna.

In some embodiments, when used as diversity antennas, the diversity antennas can be placed sufficiently far away from each other, or put orthogonally with respect to each other to take advantage of the isolation between different polarizations.

Figure 7:
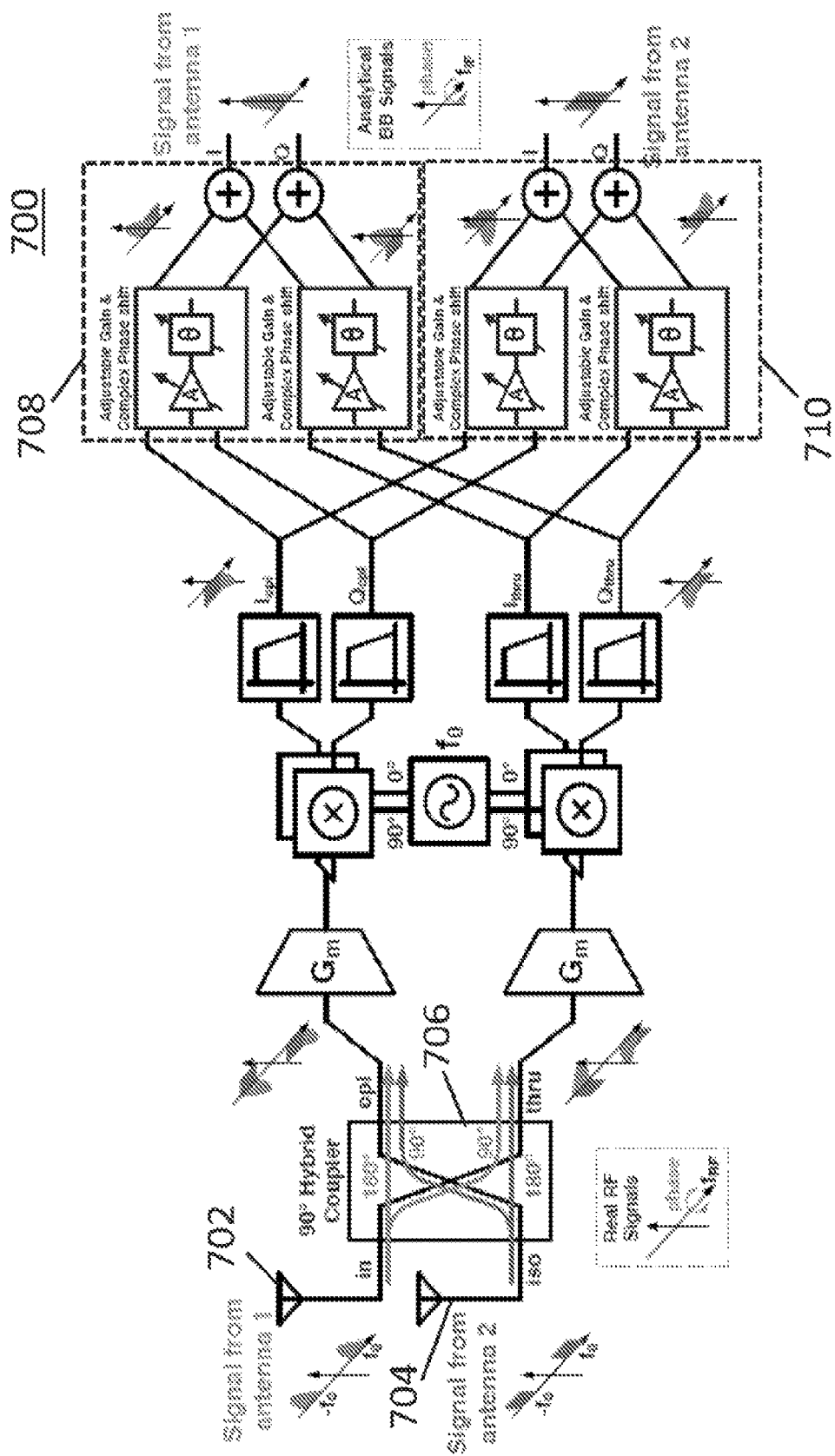
FIG. 7 is an example of using two antennas with a 90-degree hybrid coupler in accordance with some embodiments.

As shown in FIG. 7, one or more of complex combiners 708 and 710 can be used to receive signals originating from one antenna and reject signals originating from the other antenna, in some embodiments. In some embodiments, one or more of the complex combiners can alternatively be configured to provide outputs that are a combination or weighted combination of the two antennas.

In some embodiments, two diversity antennas can be separated in baseband and processed with digital signal processing. The same architecture can also be used for MIMO communications with two antennas where the analog and RF front ends can be used without any change in some embodiments.

Figure 8:
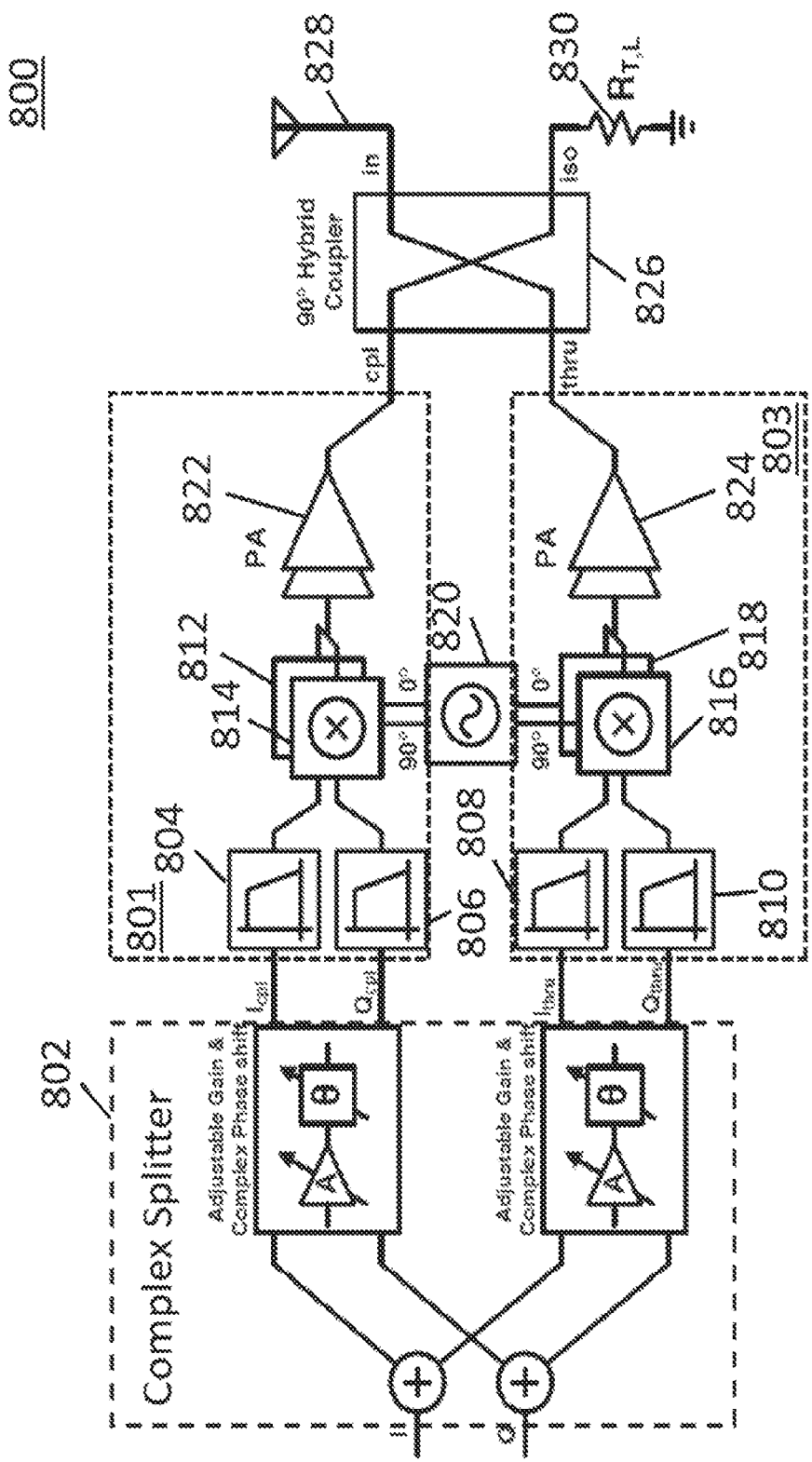
FIG. 8 is an example of a transmitter in accordance with some embodiments.

In accordance with some embodiments, a transmitter incorporating a quadrature hybrid can be provided as illustrated in FIG. 8. As shown, a transmitter 800 can include a complex splitter 802, quadrature upconverters 801 and 803, a quadrature local oscillator source 820, a quadrature hybrid 826, an antenna 828, and a termination resistor 830, in some embodiments. In some embodiments, quadrature upconverter 801 can include filters 804 and 806, mixers 812 and 814, and a power amplifier 822. In some embodiments, quadrature upconverter 803 can include filters 808 and 810, mixers 816 and 818, and a power amplifier 824.

Figure 9:
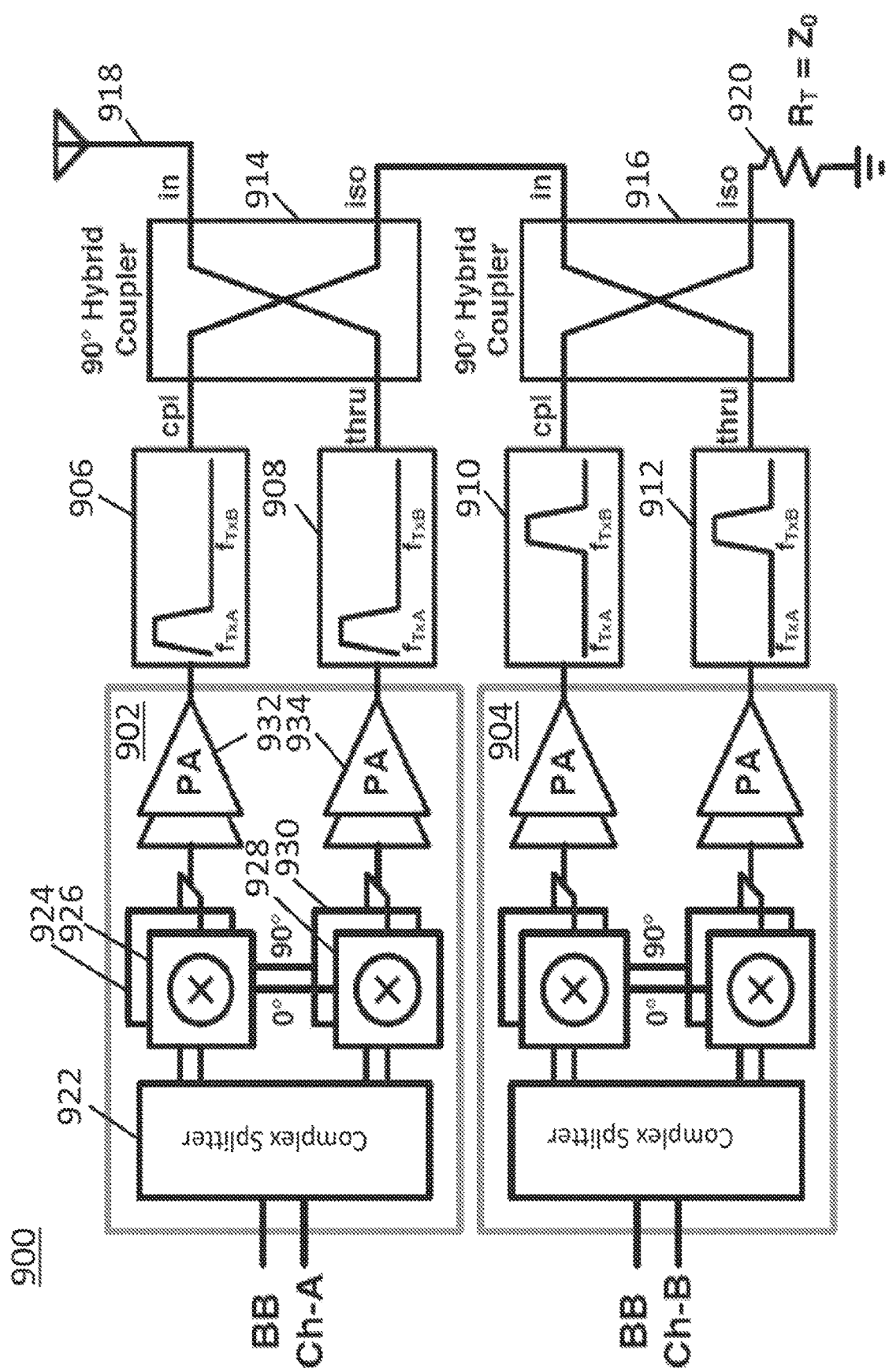
FIG. 9 is an example of another transmitter in accordance with some embodiments.

FIG. 9 shows an example 900 of a transmitter using multiple (e.g., two as illustrated) quadrature hybrids in accordance with some embodiments. As shown, transmitter 900 includes channel circuitries 902 and 904, filters 906, 908, 910, and 912, quadrature hybrids 914 and 916, an antenna 918, and a termination resistor 920. In some embodiments, channel circuitries 902 and 904 can each include a complex splitter 922, mixers 924, 926, 928, and 930, and power amplifiers 932 and 934.

Complex splitters 801 and 922 can be any suitable complex splitters, in some embodiments. For example, in some embodiments, the complex splitters can be formed from variable-gain transconductance amplifiers with coupled outputs. In some embodiments variable-gain voltage amplifiers with output voltage summing can be used Filters 804, 806, 808, and 810 can be any suitable filters, in some embodiments. For example, in some embodiments, the filters can be active or passive low pass filters of various orders and with appropriate in-band gain. The filters can be active or passive low pass filters of various orders and with appropriate in-band gain.

Filters 906, 908, 910, and 912 can be any suitable filters, in some embodiments. For example, in some embodiments, the filters can be SAW, BAW, or FBAR filters, cavity filters, ceramic filters, etc.

Mixers 812, 814, 816, 818, 924, 926, 928, and 930 can be any suitable upconversion mixers, in some embodiments. For example, in some embodiments, the mixers can be active or passive mixers.

Quadrature hybrids 826, 914, and 916 can be any suitable quadrature hybrids, in some embodiments. For example, in some embodiments, each can be implemented using a model X3C17A1-03WS surface mount quadrature hybrid available from ANAREN, INC. of East Syracuse, N.Y., USA.

Antennas 828 and 918 can be any suitable antennas, in some embodiments. For example, in some embodiments, antennas 828 and 918 can be any antennas suitable to receive any suitable one or more frequencies, or one or more ranges of frequencies, of signals.

Termination resistors 830 and 920 can be any suitable resistors and have any suitable values (e.g., 50 ohms), in some embodiments.

In transmitter 900, filters 906 and 908 can provide reflective output impedances at the out-of-band frequencies so that any out-of-band-frequency signals received from the in port of quadrature hybrid 916 at the iso port of quadrature hybrid 914 can be reflected to the in port of quadrature hybrid 914, and hence to antenna 918. In some embodiments, the out-of-band frequencies at which filters 906 and 908 are reflective may be limited to the frequencies of channel B. Likewise, filters 910 and 912 can provide reflective output impedances out-of-band frequencies so that any out-of-band-frequency signals received from the iso port of quadrature hybrid 914 at the in port of quadrature hybrid 916 can be reflected to the iso port of quadrature hybrid 916. In some embodiments, the out-of-band frequencies at which filters 910 and 912 are reflective may be limited to the frequencies of channel A. In some embodiments, filters 906, 908, 910, and 912 can be high quality SAW filters of different frequencies. SAW filters usually present reflective impedance at out-of-band frequencies.

Figure 10:
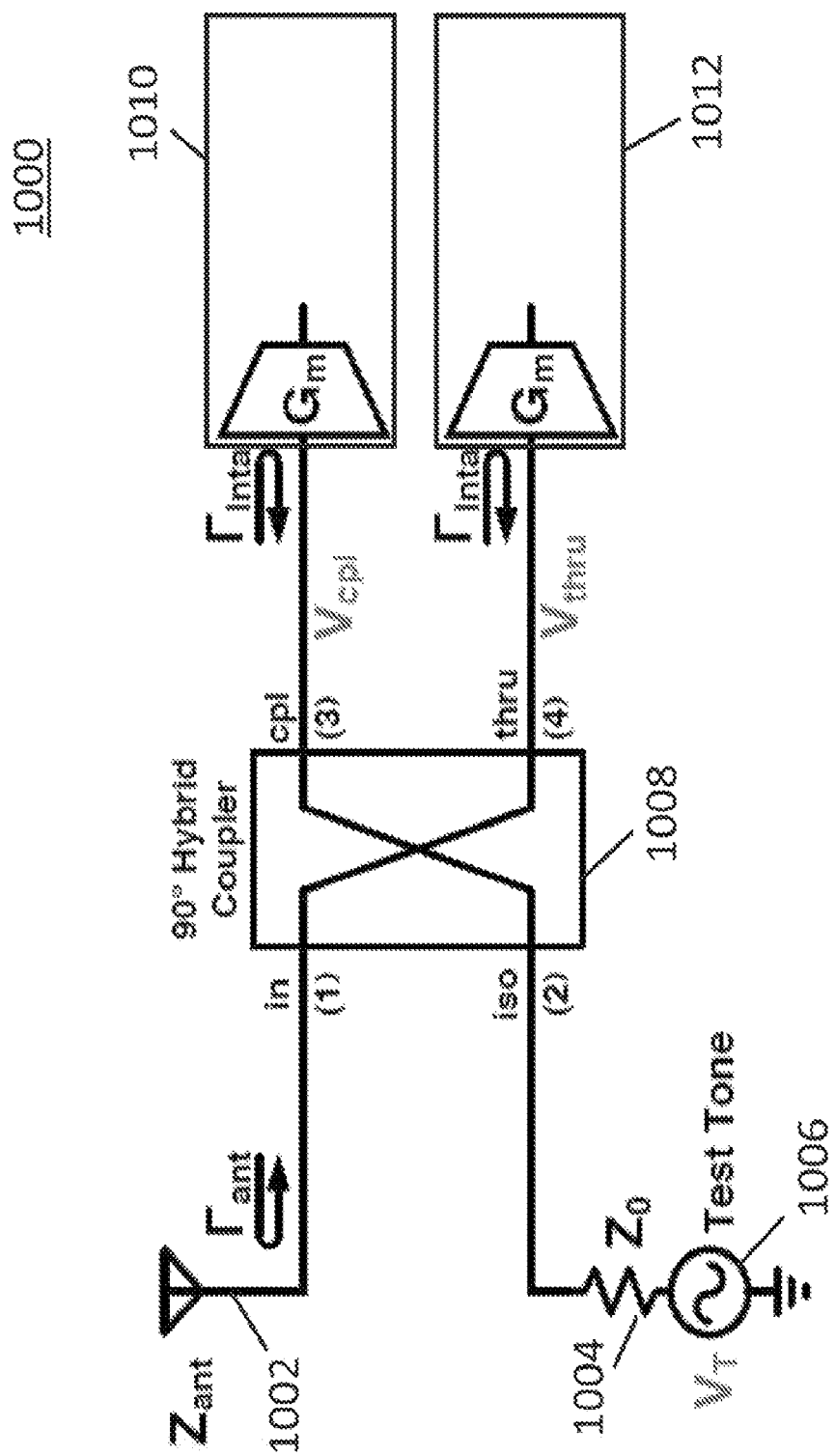
FIG. 10 is an example of antenna impedance measurement in accordance with some embodiments.

In accordance with some embodiments, the reflection coefficient of an antenna connected to a receiver as described herein can be measured. For example, as shown in FIG. 10, a configuration 1000 for measuring an antenna's reflection coefficient in accordance with some embodiments is shown. As illustrated, this configuration includes an antenna 1002, a termination resistor 1004, a test tone generator 1006, a quadrature hybrid 1008, and quadrature downconverters 1010 and 1012 (which can include the transconductors shown).

In this embodiment, the transconductors in quadrature downconverters 1010 and 1012 present largely capacitive input impedances, which results in a close-to-unity reflection coefficient $\Gamma_{Inta}$ at each transconductor. Thus, upon power being injected at the iso port, most of that power should be redirected to the in port of the quadrature hybrid and terminated at the antenna. However, if the antenna has non-perfect impedance, a wave will reflect from the antenna to the in port and then to the cpl port and the thru port. This reflection at the cpl port and the thru port can be measured as $V_{cpl}$ and $V_{thru}$ as shown in FIG. 10. Thus, by measuring the deviation of the phase/magnitude relationship of $V_{cpl}$ and $V_{thru}$, the reflection coefficient from the antenna can be measured.

In some embodiments, in order to measure the impedance of antenna 1002, a test tone can be injected into the iso port of the quadrature hybrid using test tone generator 1006. Voltages at the cpl port and the thru port of the quadrature hybrid can then be measured with the quadrature downconverters 1010 and 1012. Because the quadrature downconverters are driven with coherent local oscillator (LO) clocks, both the relative magnitude and phase difference of $V_{cpl}$ and $V_{thru}$ can be measured.

As described above in connection with FIG. 6, noise from a termination resistor $R_T$ can be cancelled out by a receiver in accordance with some embodiments. However, in some instances, non-idealities in the quadrature hybrid, the interconnections, the quadrature downconverters, the complex signal combiner, and the antenna impedance can cause non-perfect cancellation of this noise.

Figure 11:
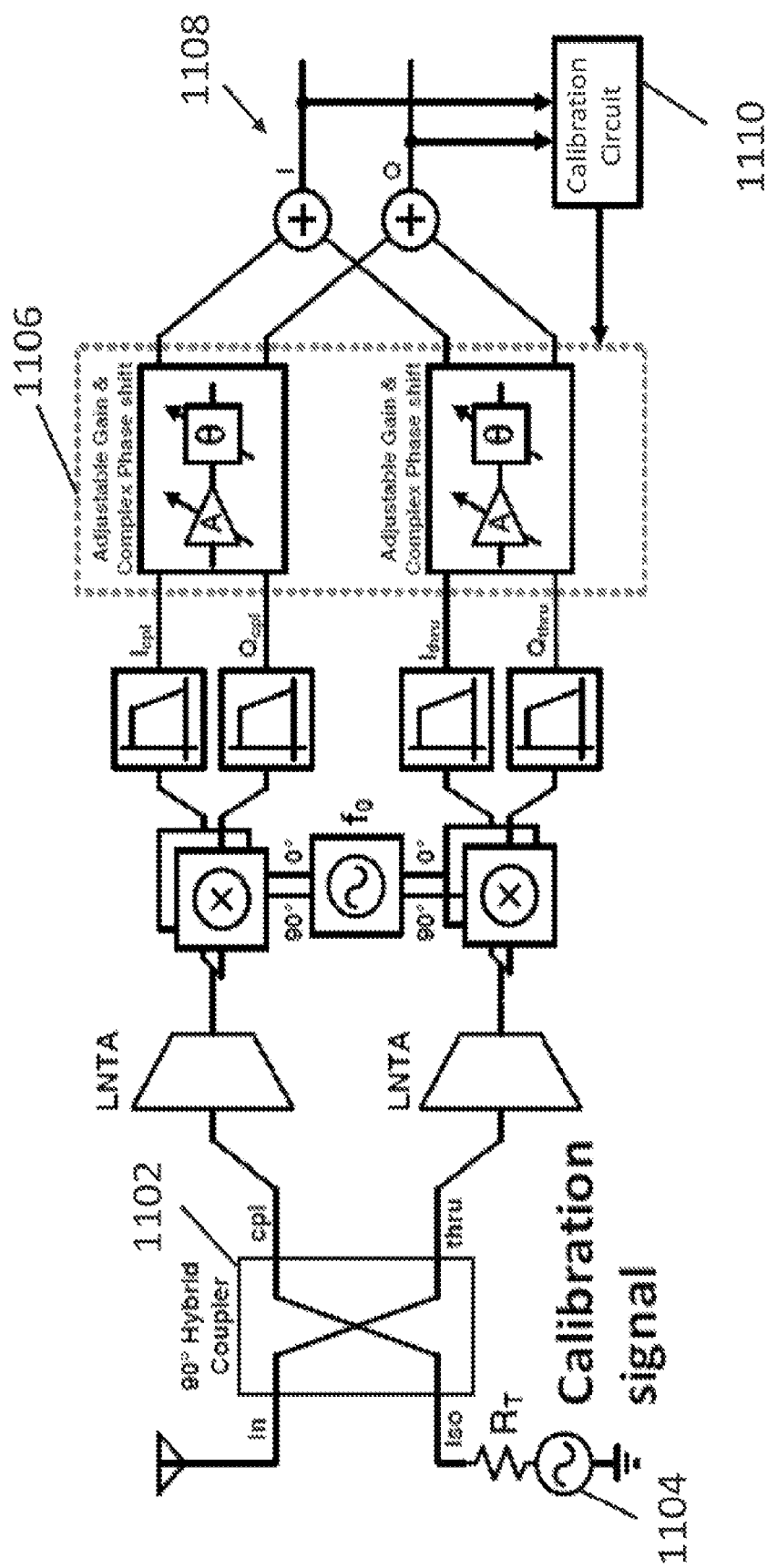
FIG. 11 is an example of calibration in accordance with some embodiments.

In some embodiments, as shown in FIG. 11, the cancellation of the noise can be improved by inserting a test tone at the iso port of quadrature hybrid 1102 using a test tone generator 1104 and tuning the phase and the gain of complex combiner 1106 to minimize the combined complex baseband measured at I and Q output 1108 by calibration circuit 1110. In some embodiments, the calibration signal is not limited to a single tone. Rather, in some embodiments, a modulated and/or noise like signal can be used to reduce in-band spurious emission to the antenna.

The calibration circuit takes in the I and Q signals in analog or digital form and then outputs control signals for adjusting gain and complex phase shift. The calibration circuit can be implemented in any suitable manner. For example, the calibration circuit can be implemented using analog and/or digital circuits in some embodiments. As another example, the calibration circuit can be implemented using a hardware processor and software in some embodiments. In some embodiments, the calibration circuit can be part of another circuit.

Figure 12:
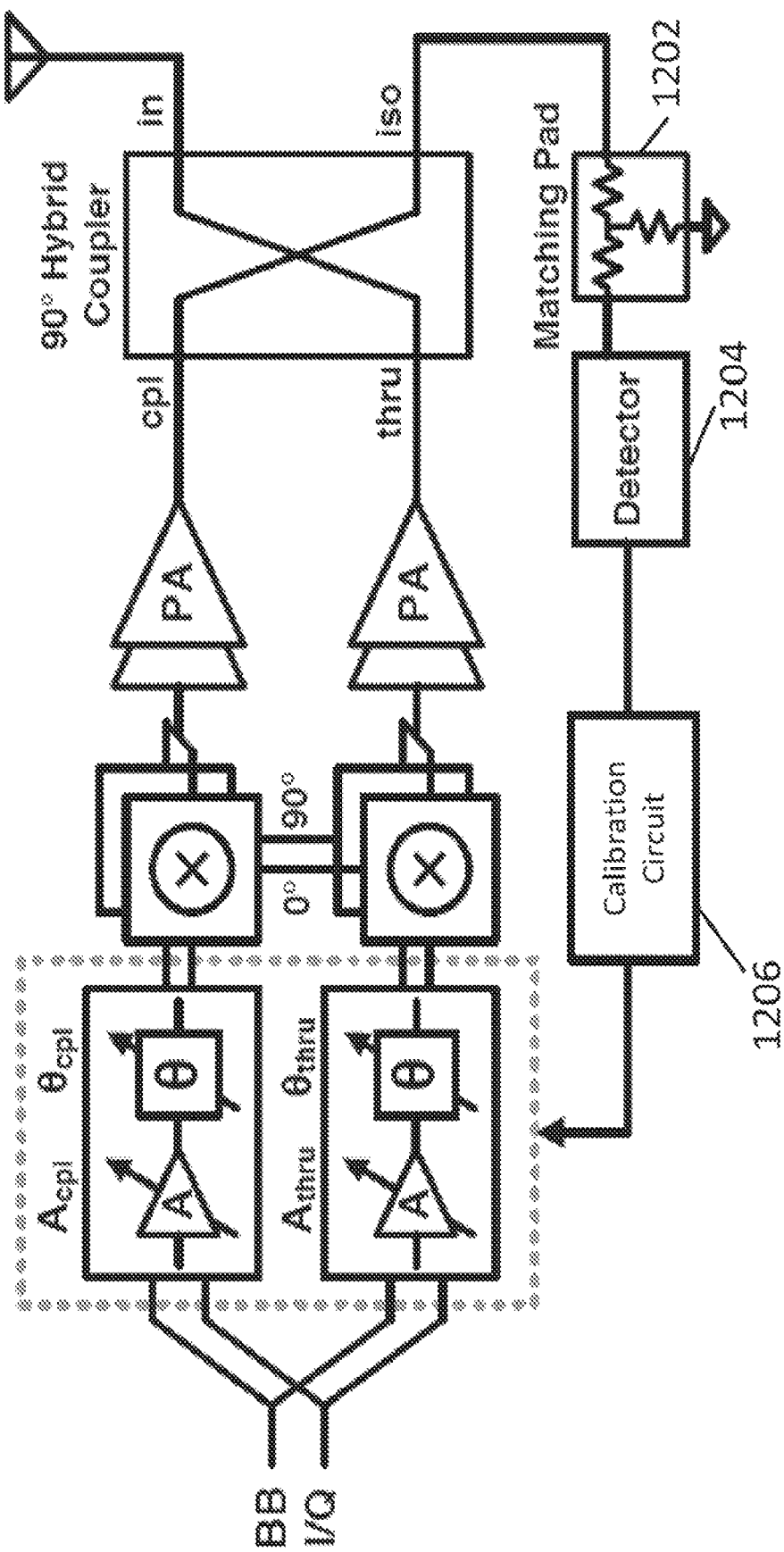
FIG. 12 is another example of calibration in accordance with some embodiments.

Similarly, in some embodiments, a transmitter can be calibrated to improve its performance. With proper calibration, transmit power dissipation on the termination resistor of the transmitter can be minimized and the power added efficiency (PAE) of the power amplifiers of the transmitter can be improved. In some embodiments, for example, transmitter calibration can be performed by sensing the signal at the termination resistor and minimizing its power level by adjusting the coefficients of the complex combiner. As another example, in some embodiments, as shown in FIG. 12, baseband I and Q signals can be provided to the transmitter and then transmitted power leakage at the iso port (after the termination resistor is removed) can be measured using matching pad 1202 and detector 1204. The detected leakage power level can then be used by a calibration circuit 1206 to optimize the coefficients in the complex combiner so that the leakage power at the iso port is minimized.

The calibration circuit can be implemented in any suitable manner. For example, the calibration circuit can be implemented using analog and/or digital circuits in some embodiments. As another example, the calibration circuit can be implemented using a hardware processor and software in some embodiments. In some embodiments, the calibration circuit can be part of another circuit.

Figure 13:
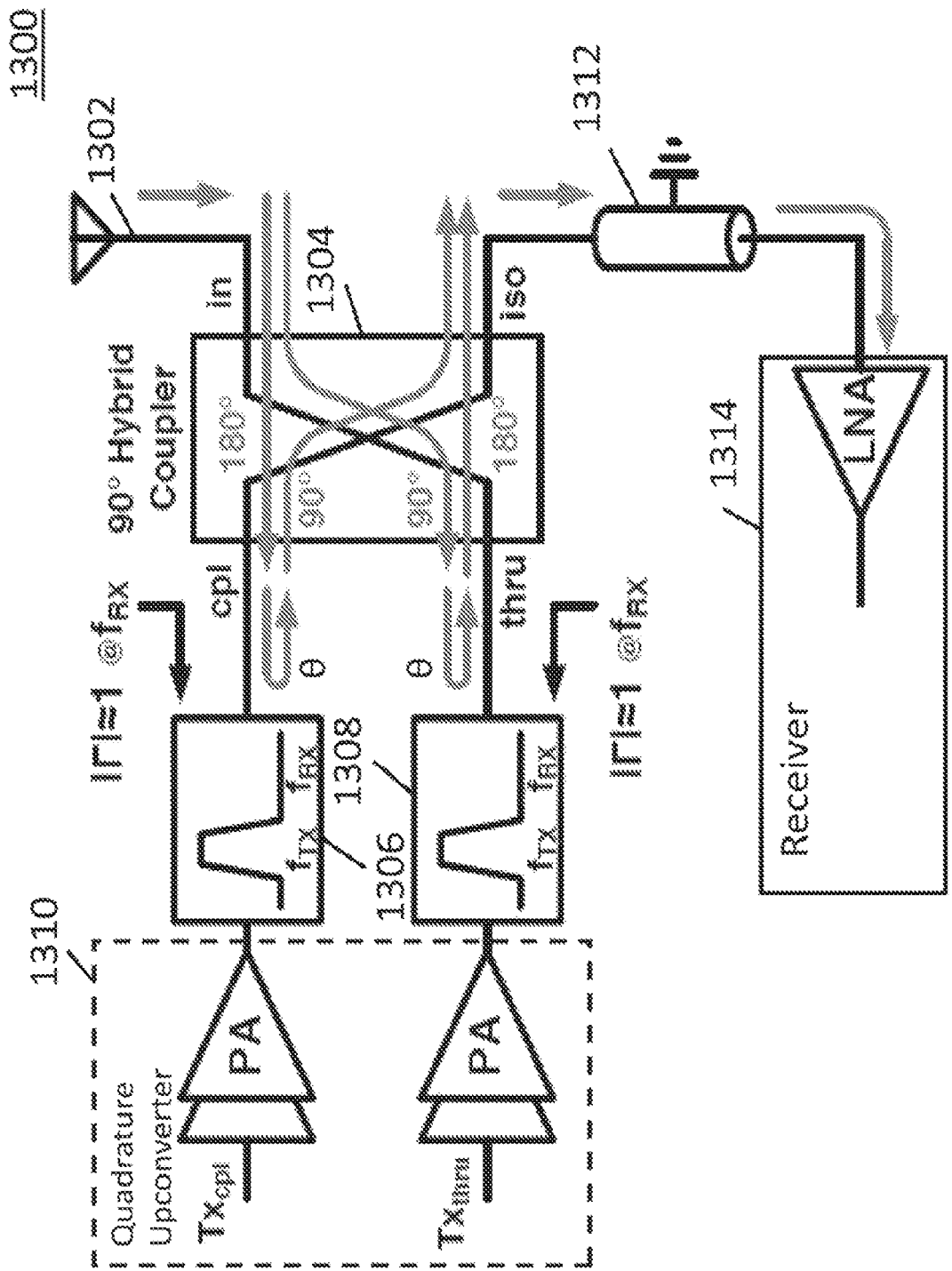
FIG. 13 is an example of a transceiver receive a signal in accordance with some embodiments.

Turning to FIG. 13, an example 1300 of a transceiver in accordance with some embodiments is shown. As illustrated, transceiver 1300 includes an antenna 1302, a quadrature hybrid 1304, filters 1306 and 1308, a quadrature upconverter 1310, a connection 1312, and a receiver 1314.

Antennas 1302 can be any suitable antenna, in some embodiments. For example, in some embodiments, antenna 1302 and 202 can be an antenna suitable to receive any suitable one or more frequencies, or one or more ranges of frequencies, of signals.

Quadrature hybrids 1304 can be any suitable quadrature hybrid, in some embodiments. For example, in some embodiments, each can be implemented using a model X3C17A1-03WS surface mount quadrature hybrid available from ANAREN, INC. of East Syracuse, N.Y., USA.

Filters 1306 and 1308 can be any suitable filters, in some embodiments. For example, in some embodiments, the filters can be SAW, BAW, or FBAR filters, cavity filters, ceramic filters, etc.

Connection 1312 can be any suitable connection between the quadrature hybrid and the receiver, in some embodiments. For example, in some embodiments, the connection can be a wire connection, a printed circuit board trace, a transmission line, etc.

Quadrature upconverter 1310 can be any suitable transmitter quadrature upconverter in some embodiments. For example, quadrature upconverter 1310 can be implemented using the components of quadrature upconverter 801 of FIG. 8 in some embodiments.

Receiver 1314 can be any suitable receiver.

As shown in FIG. 13, if the in port of the quadrature hybrid is connected to an antenna, the cpl port and the thru port of the quadrature hybrid are connected to filters, and the iso port of the quadrature hybrid is connected to a receiver, the quadrature hybrid can act as a duplexer.

As illustrated in FIG. 13, when a signal having a frequency $f_{RX}$ is received at the in port of quadrature hybrid 1304 from antenna 1302, the signal is split and sent to the cpl port and the thru port of the quadrature hybrid. Because filters 1306 and 1308 reflect signals at $f_{RX}$ as shown in FIG. 13, the signals are reflected back into the cpl port and the thru port to the iso port of the quadrature hybrid, connection 1312, and receiver 1314. As the signal propagates from the in port to the iso port, it undergoes a 270-plus-θ-degree phase shift.

Figure 14:
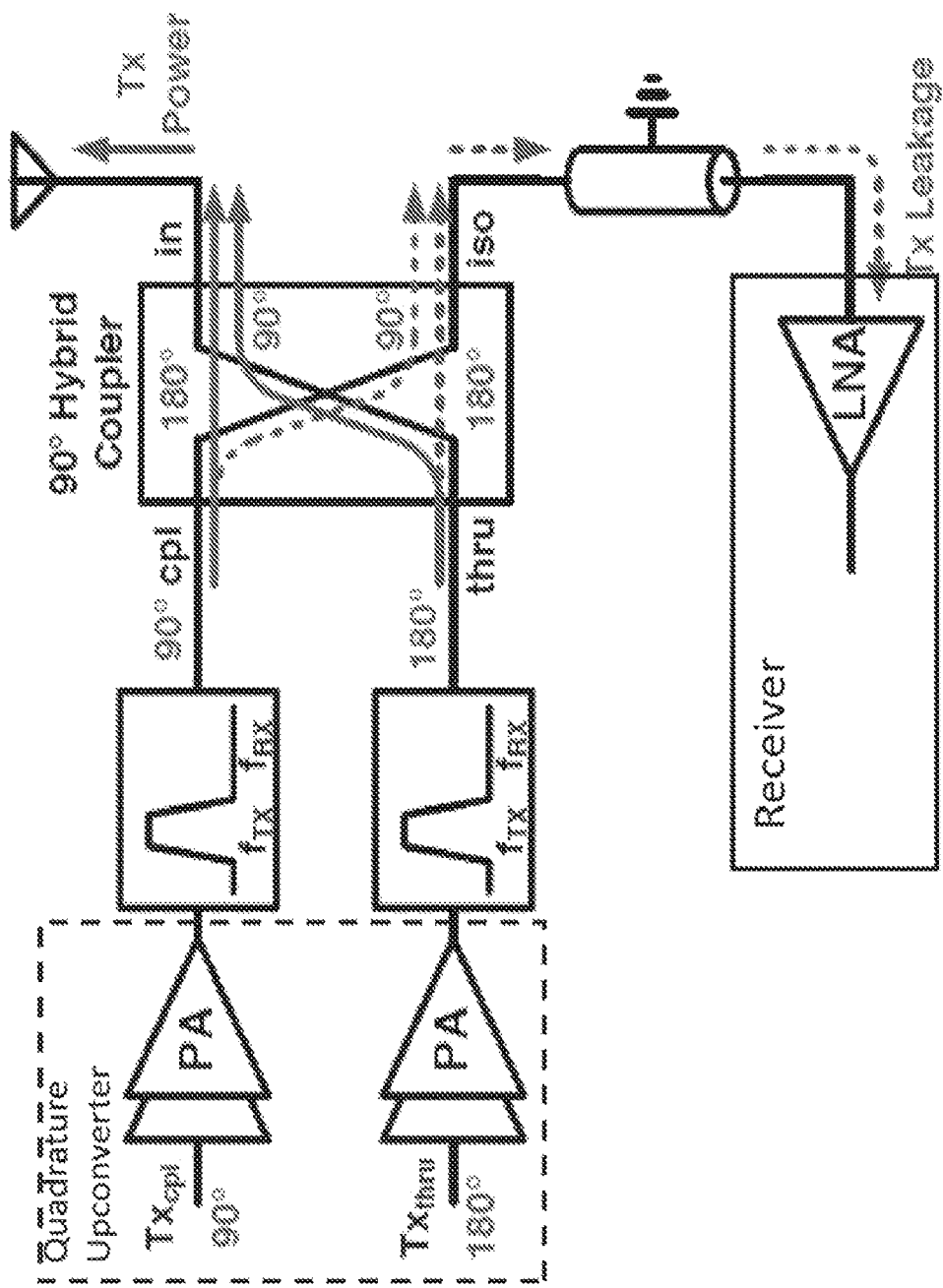
FIG. 14 is an example of a transceiver transmitting a signal in accordance with some embodiments.

As illustrated in FIG. 14, when a signal is transmitted from the quadrature upconverter through the filters, the signals received at the cpl port and the thru port are already shifted 90 degrees and 180 degrees, respectively. In the quadrature hybrid, these signals then undergo additional 180-degree and 90-degree, respectively, phase shifts (for a total phase shift of 270 degrees each) before exiting the in port of the quadrature hybrid and going to the antenna. A portion of the signals at the cpl port and the thru port may also be leaked to the iso port. However, because the signal from the cpl port undergoes a 90-degree phase shift (resulting in a total phase shift of 180 degrees) and because the signal from the thru port undergoes a 180-degree phase shift (resulting in a total phase shift of 360 degrees), the resulting signals at the iso port are 180 degrees out of phase and thus cancel out.

Figure 15:
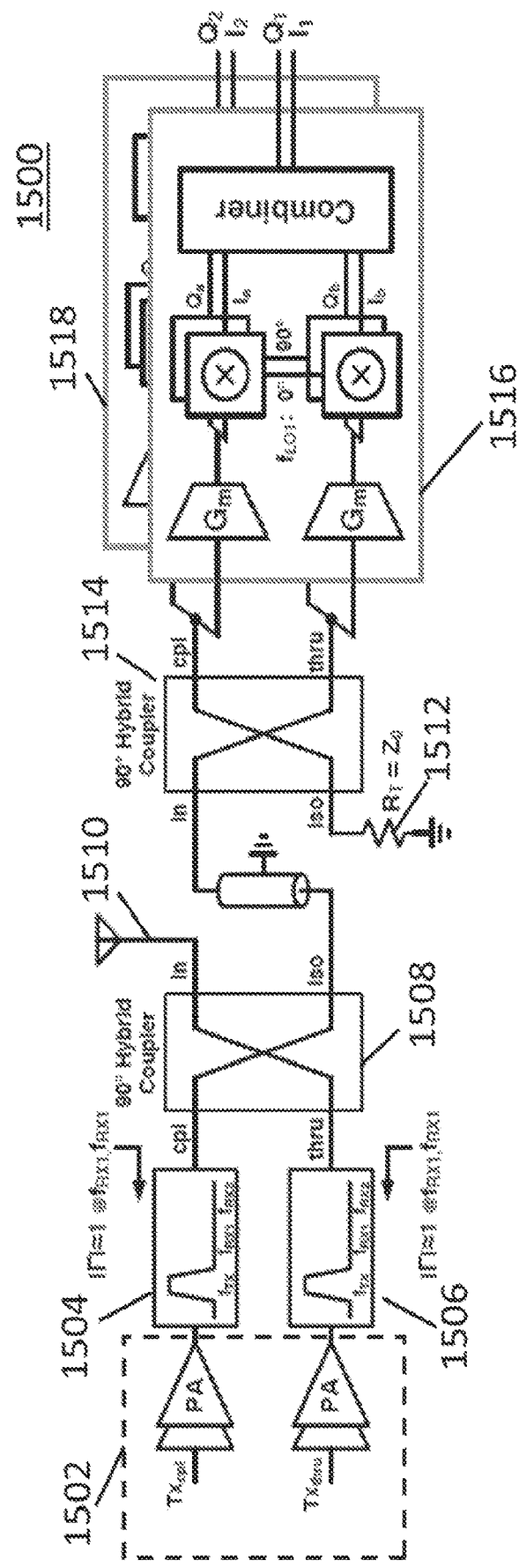
FIG. 15 is an example of a transceiver in accordance with some embodiments.

FIG. 15 shows an example of a transceiver 1500, which can include a transmitter channel circuitry 1502 (which can include a complex combiner (not shown) and two quadrature upconverters (only power amplifiers shown)), two filters 1504 and 1506, quadrature hybrids 1508 and 1514, an antenna 1510, a termination resistor 1512, and receiver channel circuitries 1516 and 1518 (each including two quadrature downconverters and a complex combiner) in accordance with some embodiments. These components can be implemented in a similar manner to similarly named components of other figures in some embodiments.

Figure 16:
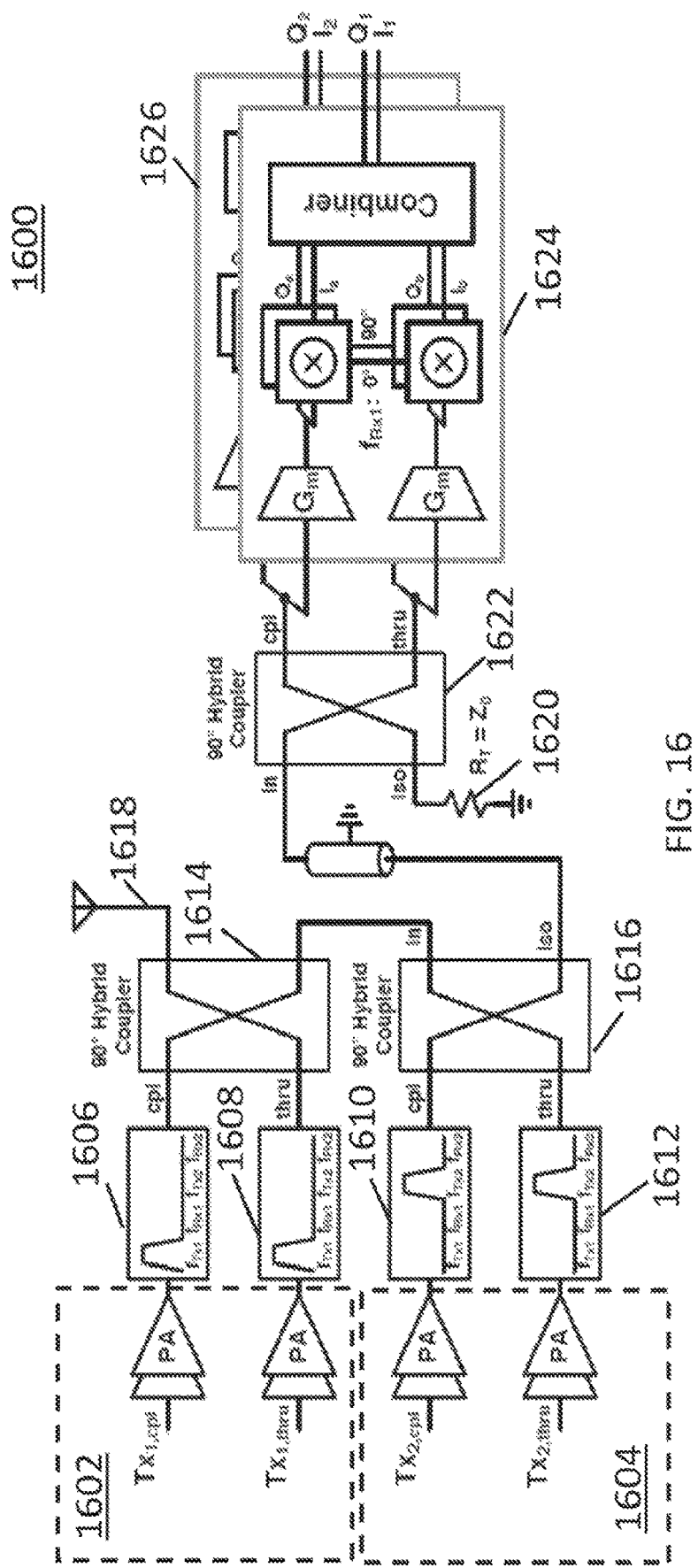
FIG. 16 is an example of another transceiver in accordance with some embodiments.

FIG. 16 shows an example of a transceiver 1600, which can include transmitter channel circuitries 1602 and 1604 (which can include a complex combiner (not shown) and two quadrature upconverters (only power amplifiers shown)), four filters 1606, 1608, 1610, and 1612, quadrature hybrids 1614, 1616, and 1622, an antenna 1618, a termination resistor 1620, and receiver channel circuitries 1624 and 11626 (each including two quadrature downconverters and a complex combiner) in accordance with some embodiments. These components can be implemented in a similar manner to similarly named components of other figures in some embodiments.

Although specific configurations of transmitters and receivers are presented herein for purposes of illustration of possible transceivers, it should be apparent that any suitable number of transmitters and any suitable numbers of receivers can be included in a transceiver in accordance with some embodiments.

Figure 17:
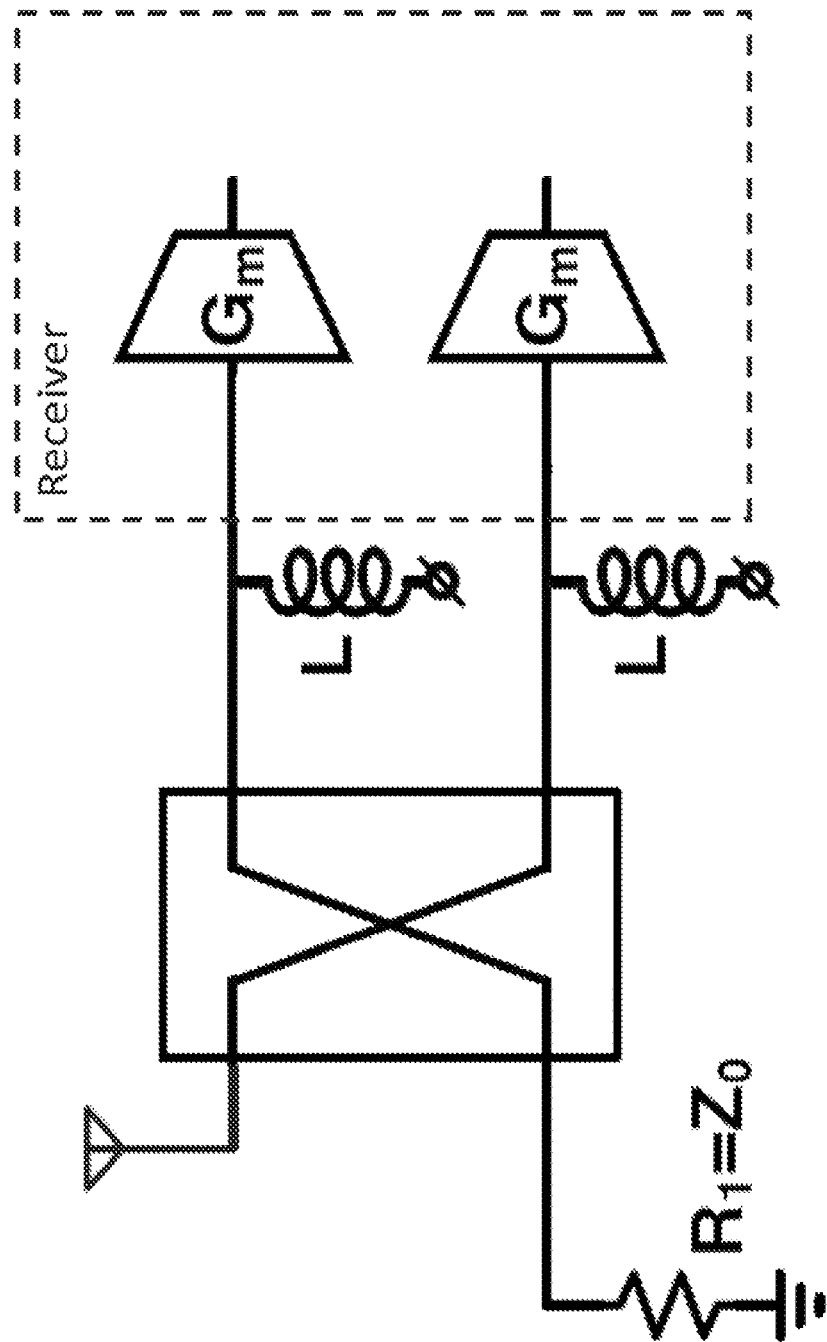
FIG. 17 is an example of inductors at cpl and thru ports of a 90-degree hybrid coupler in accordance with some embodiments.

In some embodiments, to improve the achievable bandwidth in receivers as described herein, inductors can be placed at the inputs to the LNTA transconductances (Gms)

as shown in FIG. 17. Because inductors configured in this way are parallel with the input capacitance of the LNTA Gms, they can be used to resonate out that capacitance at higher frequencies.

Figure 18:
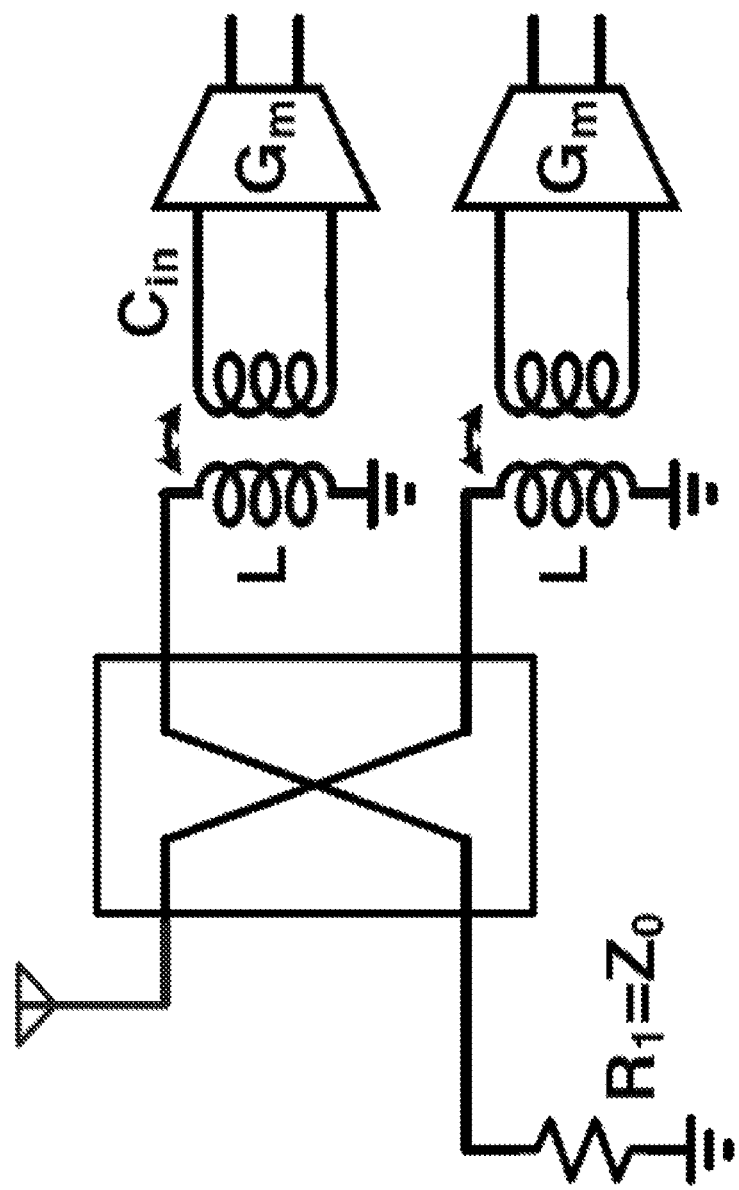
FIG. 18 is an example of transformers at cpl and thru ports of a 90-degree hybrid coupler in accordance with some embodiments.

In some embodiments, as shown in FIG. 18, transformers can be placed at the inputs to the LNTA Gms to resonate out the input capacitance of the LNTA Gms. Any suitable turn ratio (e.g., 1:1, or any other suitable value) between the primary and secondary windings can be used in some embodiments. Higher turn ratios may give passive voltage gain and improve the noise figure, but may also reduce the bandwidth of the receiver.

Figure 19:
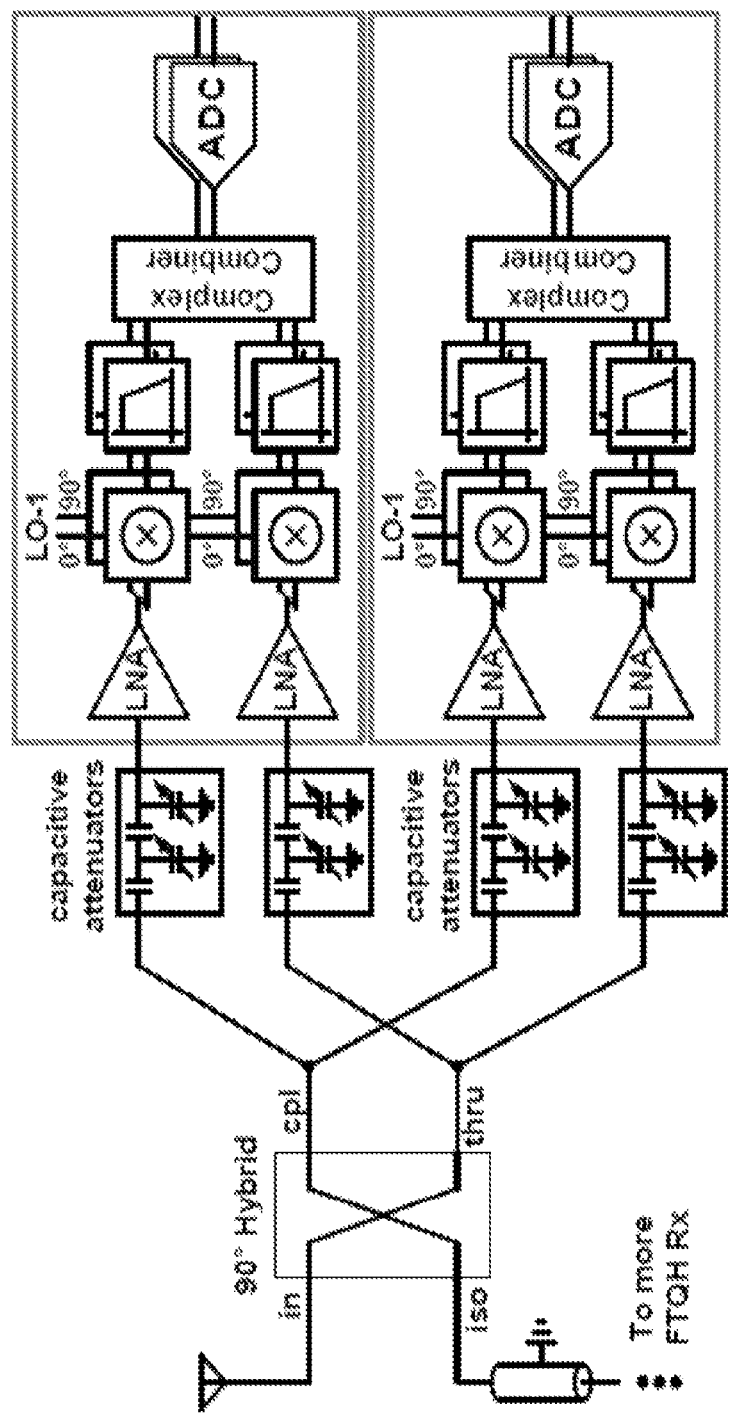
FIG. 19 is an example of capacitive attenuators at cpl and thru ports of a 90-degree hybrid coupler in accordance with some embodiments.

In some embodiments, as shown in FIG. 19, capacitive attenuators can be placed at the inputs to the quadrature downconverters to improve receiver linearity. Although FIG. 19 shows one capacitive attenuator for each quadrature downconverter input, in some embodiments a single capacitive attenuator can be placed between the inputs of each quadrature downconverter.

FIG. 20 illustrates an example 2001 of an integrated circuit that can be provided in some embodiments. Also illustrated are an antenna 2002, a quadrature hybrid 2004, a termination resistor 2006, common source (CS) LNTAs 2008, mixers 2014, multiplexers 2012, divide-by-four circuits 2010, field programmable transimpedance amplifiers 2016, harmonic combiners 2018, transimpedance amplifiers 2020, and complex combiners 2022.

Antenna 2002, quadrature hybrid 2004, and termination resistor can be implemented as described in connection with the other figures in some embodiments.

Each CS LNTA 2008 can be formed from any suitable number (e.g., 16) of slices in some embodiments. Each slice can be implemented as shown in slice 2024 in some embodiments.

Each mixer 2014 can be formed from any suitable number (e.g., 8) of mixer drivers in some embodiments. Each mixer driver can be implemented as shown in mixer driver 2026 in some embodiments.

Each multiplexer 2012 can be implemented in any suitable manner in some embodiments.

Each divide-by-four circuit 2010 can be implemented in any suitable manner in some embodiments.

Each field programmable transimpedance amplifier can be implemented in any suitable manner, such as shown in the figure, in some embodiments.

Each harmonic combiner can be implemented in any suitable manner, in some embodiments.

Each transimapendance amplifier 2020 can be implemented in any suitable manner, such as shown in the figure, in some embodiments.

Each complex combiner 2022 can be implemented in any suitable manner in some embodiments. For example, the complex combiner can be implemented using a network of variable transconductors as shown in the figure.

In integrated circuit 2001, two independent receiver channels (A and B) share quadrature hybrid 2004. In some embodiments, channel A and B can operate independently with different local oscillator (LO) frequencies or can be driven synchronously with a coherent LO so that the two channels can be combined to further reduce the noise factor. In some embodiments, the multi-slice programmable current-reuse CS LNTAs 2008 enable adaptive, in-the-field adjustments of the transconductance (Gm) to reduce power consumption when high sensitivity is not needed. As shown, LNTAs 2008 drive 8-phase current-mode passive mixers 2014 clocked by 12.5%-duty-cycle non-overlapping clock signals. The down-converted currents are then filtered and amplified by the inverter-based field programmable TIAs 2016 with programmable bandwidth, gain and power consumption. Harmonic rejecting resistive networks 2018 and TIAs 2020 recombine the 8-phase baseband signal to reject 3rd and 5th order LO harmonics and reduce noise folding from the harmonics. The fully differential I and Q baseband signals from the cpl path and the thru path are then recombined with a phase shift, which is nominally 90 degrees, by complex combiner 2022. The phase and magnitude imbalances of quadrature hybrid 2004 can be corrected in the complex combiner to improve cancellation of the termination resistor noise.

In some embodiments, integrate circuit 2001 can be designed and fabricated in a 65 nm GP CMOS technology. In some embodiments, the LO frequency can be set between 600 MHz and 2200 MHz.

Figure 21:
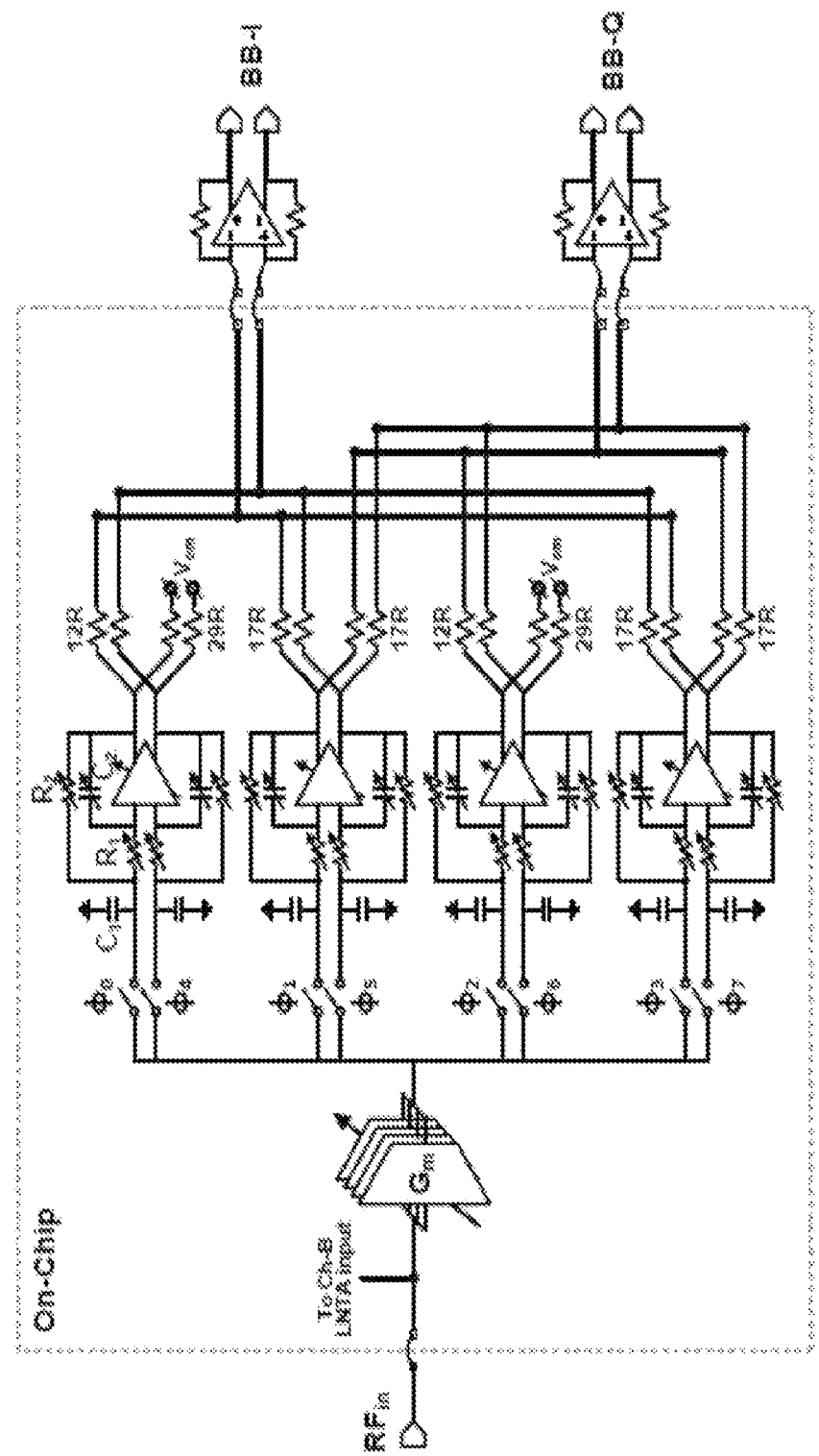
FIG. 21 is an example of more detailed connections in an integrated circuit in accordance with some embodiments.

FIG. 22 shows more details of the connection a quadrature downconversion chain of channel A of FIG. 21 in accordance with some embodiments. In this figure, the values 12R, 29R, and 17R represent relative resistor values. For example, if R is selected to be 1 k ohm, then 12R is 12 k ohm, 29R is 29 k ohm, and 17R is 17 k ohm.

Although the invention has been described and illustrated in the foregoing illustrative embodiments, it is understood that the present disclosure has been made only by way of example, and that numerous changes in the details of embodiment of the invention can be made without departing from the spirit and scope of the invention, which is limited only by the claims that follow. Features of the disclosed embodiments can be combined and rearranged in various ways.

What is claimed is:

1. A circuit for wireless communication comprising:
    a first quadrature hybrid having a first in port, a first iso port, a first cpl port, and a first thru port;
    a first mixer having a first input coupled to the first cpl port and having an output;
    a second mixer have a first input coupled to the first cpl port and having an output;
    a third mixer having a first input coupled to the first thru port and having an output;
    a fourth mixer having a first input coupled to the first thru port and having an output;
    a first filter having an input connected to the output of the first mixer and having an output;
    a second filter having an input connected to the output of the second mixer and having an output;
    a third filter having an input connected to the output of the third mixer and having an output;
    a fourth filter having an input connected to the output of the fourth mixer and having an output; and
    a first complex combiner having inputs connected to the output of the first filter, the output of the second filter, the output of the third filter, and the output of the fourth filter that provides first I and Q outputs based the output of the first filter, the output of the second filter, the output of the third filter, and the output of the fourth filter.

2. The circuit of claim 1, further comprising an antenna connected to the first in port.

3. The circuit of claim 1, further comprising:
    a first low noise transconductance amplifier having an input connected to the first cpl port and an output connected to the first input of the first mixer and the first input of the second mixer; and
    a second low noise transconductance amplifier having an input connected to the first thru port and an output connected to the first input of the third mixer and the first input of the fourth mixer.

4. The circuit of claim 3, further comprising:
a fifth mixer having a first input coupled to the first cpl port and having an output;
a sixth mixer have a first input coupled to the first cpl port and having an output;
a seventh mixer having a first input coupled to the first thru port and having an output;
an eighth mixer having a first input coupled to the first thru port and having an output; and
a second complex combiner having inputs coupled to the output of the fifth mixer, the output of the sixth mixer, the output of the seventh mixer, and the output of the eighth mixer that provides second I and Q outputs.

5. The circuit of claim 4, further comprising:
a third low noise transconductance amplifier having an input connected to the first cpl port and an output connected to the first input of the fifth mixer and the first input of the sixth mixer; and
a fourth low noise transconductance amplifier having an input connected to the first thru port and an output connected to the first input of the seventh mixer and the first input of the eighth mixer.

6. The circuit of claim 4, further comprising:
a fifth filter having an input connected to the output of the fifth mixer and having an output connected to a first of the inputs of the second complex combiner;
a sixth filter having an input connected to the output of the sixth mixer and having an output connected to a second of the inputs of the second complex combiner;
a seventh filter having an input connected to the output of the seventh mixer and having an output connected to a third of the inputs of the second complex combiner; and
an eighth filter having an input connected to the output of the eighth mixer and having an output connected to a fourth of the inputs of the second complex combiner.

7. The circuit of claim 1, further comprising a termination resistor connected to the first iso port.

8. The circuit of claim 5, further comprising a second quadrature hybrid having a second in port, a second iso port, a second cpl port, and a second thru port, wherein the second in port is connected to the first iso port.

9. The circuit of claim 8, further comprising:
a ninth mixer having a first input coupled to the second cpl port and having an output;
a tenth mixer have a first input coupled to the second cpl port and having an output;
an eleventh mixer having a first input coupled to the second thru port and having an output;
a twelfth mixer having a first input coupled to the second thru port and having an output; and
a third complex combiner having inputs coupled to the output of the ninth mixer, the output of the tenth mixer, the output of the eleventh mixer, and the output of the twelfth mixer that provides third I and Q outputs.

10. The circuit of claim 9, further comprising:
a fifth low noise transconductance amplifier having an input connected to the second cpl port and an output connected to the first input of the ninth mixer and the first input of the tenth mixer; and
a sixth low noise transconductance amplifier having an input connected to the second thru port and an output connected to the first input of the eleventh mixer and the first input of the twelfth mixer.

11. The circuit of claim 9, further comprising:
a ninth filter having an input connected to the output of the ninth mixer and having an output connected to a first of the inputs of the third complex combiner;
a tenth filter having an input connected to the output of the tenth mixer and having an output connected to a second of the inputs of the third complex combiner;
an eleventh filter having an input connected to the output of the eleventh mixer and having an output connected to a third of the inputs of the third complex combiner; and
a twelfth filter having an input connected to the output of the twelfth mixer and having an output connected to a fourth of the inputs of the third complex combiner.

12. The circuit of claim 9, further comprising:
a thirteenth mixer having a first input coupled to the second cpl port and having an output;
a fourteenth mixer have a first input coupled to the second cpl port and having an output;
a fifteenth mixer having a first input coupled to the second thru port and having an output;
a sixteenth mixer having a first input coupled to the second thru port and having an output; and
a fourth complex combiner having inputs coupled to the output of the thirteenth mixer, the output of the fourteenth mixer, the output of the fifteenth mixer, and the output of the seventeenth mixer that provides second I and Q outputs.

13. The circuit of claim 12, further comprising:
a seventh low noise transconductance amplifier having an input connected to the second cpl port and an output connected to the first input of the thirteenth mixer and the first input of the fourteenth mixer; and
an eighth low noise transconductance amplifier having an input connected to the second thru port and an output connected to the first input of the fifteenth mixer and the first input of the sixteenth mixer.

14. The circuit of claim 12, further comprising:
a thirteenth filter having an input connected to the output of the thirteenth mixer and having an output connected to a first of the inputs of the fourth complex combiner;
a fourteenth filter having an input connected to the output of the fourteenth mixer and having an output connected to a second of the inputs of the fourth complex combiner;
a fifteenth filter having an input connected to the output of the fifteenth mixer and having an output connected to a third of the inputs of the fourth complex combiner; and
a sixteenth filter having an input connected to the output of the sixteenth mixer and having an output connected to a fourth of the inputs of the fourth complex combiner.

15. The circuit of claim 1, wherein the first iso port is coupled to a calibration signal.

16. The circuit of claim 1, further comprising a calibration circuit that controls the first complex combiner.

17. The circuit of claim 8, further comprising a third quadrature hybrid having a third in port, a third iso port, a third cpl port, and a third thru port, wherein the third iso port is connected to the first in port.

18. The circuit of claim 17, further comprising:
a first SAW filter having an output connected to the third cpl port; and
a second SAW filter having an output connected to the third thru port.

19. The circuit of claim 17, further comprising an antenna connected to the third in port.

20. The circuit of claim 1, further comprising:
a first inductor having a first side connected to the first cpl port; and
a second inductor having a first side connected to the first thru port.

\* \* \* \* \*

UNITED STATES PATENT AND TRADEMARK OFFICE
CERTIFICATE OF CORRECTION

PATENT NO.        : 10,763,787 B2
APPLICATION NO.   : 15/765795
DATED             : September 1, 2020
INVENTOR(S)       : Jianxun Zhu et al.

Page 1 of 1

It is certified that error appears in the above-identified patent and that said Letters Patent is hereby corrected as shown below:

In the Specification

Column 1, Lines 19-23:
"This invention was made with government support under Grant #: HR0011-12-1-0006 awarded by the Department of Defense, Defense Advanced Research Projects Agency. The government has certain rights in the invention."

Should be:
--This invention was made with government support under HR0011-12-1-0006 awarded by the Defense Advanced Research Projects Agency. The government has certain rights in the invention.--

Signed and Sealed this
Third Day of October, 2023

Katherine Kelly Vidal
*Director of the United States Patent and Trademark Office*